US012586768B2

(12) United States Patent
Dash et al.

(10) Patent No.: US 12,586,768 B2
(45) Date of Patent: Mar. 24, 2026

(54) PULSED VOLTAGE COMPENSATION FOR PLASMA PROCESSING APPLICATIONS

(71) Applicant: Applied Materials, Inc., Santa Clara, CA (US)

(72) Inventors: Shreeram Jyoti Dash, San Jose, CA (US); Michael Thomas Nichols, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 885 days.

(21) Appl. No.: 17/885,277

(22) Filed: Aug. 10, 2022

(65) Prior Publication Data

US 2024/0055244 A1     Feb. 15, 2024

(51) Int. Cl.
H01J 37/32     (2006.01)

(52) U.S. Cl.
CPC . H01J 37/3299 (2013.01); *H01J 2237/24564* (2013.01); *H01J 2237/3341* (2013.01)

(58) Field of Classification Search
None
See application file for complete search history.

(56) References Cited

U.S. PATENT DOCUMENTS

| | | | |
|---|---|---|---|
| 4,070,589 A | 1/1978 | Martinkovic |
| 4,340,462 A | 7/1982 | Koch |
| 4,464,223 A | 8/1984 | Gorin |
| 4,504,895 A | 3/1985 | Steigerwald |

| | | | |
|---|---|---|---|
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |

(Continued)

FOREIGN PATENT DOCUMENTS

| | | |
|---|---|---|
| CN | 101990353 A | 3/2011 |
| CN | 102084024 A | 6/2011 |

(Continued)

OTHER PUBLICATIONS

International Search Report/Written Opinion issued to PCT/US2022/053455 on May 9, 2023.

(Continued)

*Primary Examiner* — Robert H Kim
*Assistant Examiner* — Alina Kaliszewski
(74) *Attorney, Agent, or Firm* — Patterson + Sheridan, LLP

(57) ABSTRACT

Embodiments provided herein generally include apparatus, e.g., plasma processing systems, and methods for the plasma processing of a substrate in a processing chamber. Some embodiments are directed to a method for waveform generation, which generally includes delivering a first waveform with an associated setpoint from an energy source; detecting at least one characteristic of the first waveform; estimating a voltage decay during a portion of a pulse during the first waveform; calculating a compensation factor; and adjusting the at least one characteristic using the compensation factor to adjust a voltage decay.

20 Claims, 9 Drawing Sheets

(56) References Cited

U.S. PATENT DOCUMENTS

| | | | |
|---|---|---|---|
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 * | 6/2001 | Collins ............. H01J 37/32174 |
| | | 156/345.28 |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |

(56) References Cited

U.S. PATENT DOCUMENTS

| | | | |
|---|---|---|---|
| 8,391,025 B2 | 3/2013 | Walde et al. | |
| 8,399,366 B1 | 3/2013 | Takaba | |
| 8,419,959 B2 | 4/2013 | Bettencourt et al. | |
| 8,422,193 B2 | 4/2013 | Tao et al. | |
| 8,441,772 B2 | 5/2013 | Yoshikawa et al. | |
| 8,456,220 B2 | 6/2013 | Thome et al. | |
| 8,460,567 B2 | 6/2013 | Chen | |
| 8,466,622 B2 | 6/2013 | Knaus | |
| 8,542,076 B2 | 9/2013 | Maier | |
| 8,551,289 B2 | 10/2013 | Nishimura et al. | |
| 8,568,606 B2 | 10/2013 | Ohse et al. | |
| 8,603,293 B2 | 12/2013 | Koshiishi et al. | |
| 8,632,537 B2 | 1/2014 | McNall, III et al. | |
| 8,641,916 B2 | 2/2014 | Yatsuda et al. | |
| 8,685,267 B2 | 4/2014 | Yatsuda et al. | |
| 8,704,607 B2 | 4/2014 | Yuzurihara et al. | |
| 8,716,114 B2 | 5/2014 | Ohmi et al. | |
| 8,716,984 B2 | 5/2014 | Mueller et al. | |
| 8,735,291 B2 | 5/2014 | Ranjan et al. | |
| 8,796,933 B2 | 8/2014 | Hermanns | |
| 8,809,199 B2 | 8/2014 | Nishizuka | |
| 8,821,684 B2 | 9/2014 | Ui et al. | |
| 8,828,883 B2 | 9/2014 | Rueger | |
| 8,845,810 B2 | 9/2014 | Hwang | |
| 8,852,347 B2 | 10/2014 | Lee et al. | |
| 8,884,523 B2 | 11/2014 | Winterhalter et al. | |
| 8,884,525 B2 | 11/2014 | Hoffman et al. | |
| 8,889,534 B1 | 11/2014 | Ventzek et al. | |
| 8,895,942 B2 | 11/2014 | Liu et al. | |
| 8,907,259 B2 | 12/2014 | Kasai et al. | |
| 8,916,056 B2 | 12/2014 | Koo et al. | |
| 8,926,850 B2 | 1/2015 | Singh et al. | |
| 8,963,377 B2 | 2/2015 | Ziemba et al. | |
| 8,979,842 B2 | 3/2015 | McNall, III et al. | |
| 8,993,943 B2 | 3/2015 | Pohl et al. | |
| 9,011,636 B2 | 4/2015 | Ashida | |
| 9,039,871 B2 | 5/2015 | Nauman et al. | |
| 9,042,121 B2 | 5/2015 | Walde et al. | |
| 9,053,908 B2 | 6/2015 | Sriraman et al. | |
| 9,059,178 B2 | 6/2015 | Matsumoto et al. | |
| 9,087,798 B2 | 7/2015 | Ohtake et al. | |
| 9,101,038 B2 | 8/2015 | Singh et al. | |
| 9,105,447 B2 | 8/2015 | Brouk et al. | |
| 9,105,452 B2 | 8/2015 | Jeon et al. | |
| 9,123,762 B2 | 9/2015 | Lin et al. | |
| 9,129,776 B2 | 9/2015 | Finley et al. | |
| 9,139,910 B2 | 9/2015 | Lee et al. | |
| 9,147,555 B2 | 9/2015 | Richter | |
| 9,150,960 B2 | 10/2015 | Nauman et al. | |
| 9,159,575 B2 | 10/2015 | Ranjan et al. | |
| 9,208,992 B2 | 12/2015 | Brouk et al. | |
| 9,209,032 B2 | 12/2015 | Zhao et al. | |
| 9,209,034 B2 | 12/2015 | Kitamura et al. | |
| 9,210,790 B2 | 12/2015 | Hoffman et al. | |
| 9,224,579 B2 | 12/2015 | Finley et al. | |
| 9,226,380 B2 | 12/2015 | Finley | |
| 9,228,878 B2 | 1/2016 | Haw et al. | |
| 9,254,168 B2 | 2/2016 | Palanker | |
| 9,263,241 B2 | 2/2016 | Larson et al. | |
| 9,287,086 B2 | 3/2016 | Brouk et al. | |
| 9,287,092 B2 | 3/2016 | Brouk et al. | |
| 9,287,098 B2 | 3/2016 | Finley | |
| 9,306,533 B1 | 4/2016 | Mavretic | |
| 9,309,594 B2 | 4/2016 | Hoffman et al. | |
| 9,313,872 B2 | 4/2016 | Yamazawa et al. | |
| 9,355,822 B2 | 5/2016 | Yamada et al. | |
| 9,362,089 B2 | 6/2016 | Brouk et al. | |
| 9,373,521 B2 | 6/2016 | Mochiki et al. | |
| 9,384,992 B2 | 7/2016 | Narishige et al. | |
| 9,396,960 B2 | 7/2016 | Ogawa et al. | |
| 9,404,176 B2 | 8/2016 | Parkhe et al. | |
| 9,412,613 B2 | 8/2016 | Manna et al. | |
| 9,435,029 B2 | 9/2016 | Brouk et al. | |
| 9,483,066 B2 | 11/2016 | Finley | |
| 9,490,107 B2 | 11/2016 | Kim et al. | |
| 9,495,563 B2 | 11/2016 | Ziemba et al. | |
| 9,496,150 B2 | 11/2016 | Mochiki et al. | |
| 9,503,006 B2 | 11/2016 | Pohl et al. | |
| 9,520,269 B2 | 12/2016 | Finley et al. | |
| 9,530,667 B2 | 12/2016 | Rastogi et al. | |
| 9,536,713 B2 | 1/2017 | Van Zyl et al. | |
| 9,544,987 B2 | 1/2017 | Mueller et al. | |
| 9,558,917 B2 | 1/2017 | Finley et al. | |
| 9,564,287 B2 | 2/2017 | Ohse et al. | |
| 9,570,313 B2 | 2/2017 | Ranjan et al. | |
| 9,576,810 B2 | 2/2017 | Deshmukh et al. | |
| 9,576,816 B2 | 2/2017 | Rastogi et al. | |
| 9,577,516 B1 | 2/2017 | Van Zyl | |
| 9,583,357 B1 | 2/2017 | Long et al. | |
| 9,593,421 B2 | 3/2017 | Baek et al. | |
| 9,601,283 B2 | 3/2017 | Ziemba et al. | |
| 9,601,319 B1 | 3/2017 | Bravo et al. | |
| 9,607,843 B2 | 3/2017 | Rastogi et al. | |
| 9,620,340 B2 | 4/2017 | Finley | |
| 9,620,376 B2 | 4/2017 | Kamp et al. | |
| 9,620,987 B2 | 4/2017 | Alexander et al. | |
| 9,637,814 B2 | 5/2017 | Bugyi et al. | |
| 9,644,221 B2 | 5/2017 | Kanamori et al. | |
| 9,651,957 B1 | 5/2017 | Finley | |
| 9,655,221 B2 | 5/2017 | Ziemba et al. | |
| 9,663,858 B2 | 5/2017 | Nagami et al. | |
| 9,666,446 B2 | 5/2017 | Tominaga et al. | |
| 9,666,447 B2 | 5/2017 | Rastogi et al. | |
| 9,673,027 B2 | 6/2017 | Yamamoto et al. | |
| 9,673,059 B2 | 6/2017 | Raley et al. | |
| 9,685,297 B2 | 6/2017 | Carter et al. | |
| 9,706,630 B2 | 7/2017 | Miller et al. | |
| 9,711,331 B2 | 7/2017 | Mueller et al. | |
| 9,711,335 B2 | 7/2017 | Christie | |
| 9,728,429 B2 | 8/2017 | Ricci et al. | |
| 9,734,992 B2 | 8/2017 | Yamada et al. | |
| 9,741,544 B2 | 8/2017 | Van Zyl | |
| 9,754,768 B2 | 9/2017 | Yamada et al. | |
| 9,761,419 B2 | 9/2017 | Nagami | |
| 9,761,459 B2 | 9/2017 | Long et al. | |
| 9,767,988 B2 | 9/2017 | Brouk et al. | |
| 9,786,503 B2 | 10/2017 | Raley et al. | |
| 9,799,494 B2 | 10/2017 | Chen et al. | |
| 9,805,916 B2 | 10/2017 | Konno et al. | |
| 9,805,965 B2 | 10/2017 | Sadjadi et al. | |
| 9,812,305 B2 | 11/2017 | Pelleymounter | |
| 9,831,064 B2 | 11/2017 | Konno et al. | |
| 9,837,285 B2 | 12/2017 | Tomura et al. | |
| 9,840,770 B2 | 12/2017 | Klimczak et al. | |
| 9,852,889 B1 | 12/2017 | Kellogg et al. | |
| 9,852,890 B2 | 12/2017 | Mueller et al. | |
| 9,865,471 B2 | 1/2018 | Shimoda et al. | |
| 9,865,893 B2 | 1/2018 | Esswein et al. | |
| 9,870,898 B2 | 1/2018 | Urakawa et al. | |
| 9,872,373 B1 | 1/2018 | Shimizu et al. | |
| 9,881,820 B2 | 1/2018 | Wong et al. | |
| 9,922,802 B2 | 3/2018 | Hirano et al. | |
| 9,922,806 B2 | 3/2018 | Tomura et al. | |
| 9,929,004 B2 | 3/2018 | Ziemba et al. | |
| 9,941,097 B2 | 4/2018 | Yamazawa et al. | |
| 9,941,098 B2 | 4/2018 | Nagami | |
| 9,960,763 B2 | 5/2018 | Miller et al. | |
| 9,972,503 B2 | 5/2018 | Tomura et al. | |
| 9,997,374 B2 | 6/2018 | Takeda et al. | |
| 10,020,800 B2 | 7/2018 | Prager et al. | |
| 10,026,593 B2 | 7/2018 | Alt et al. | |
| 10,027,314 B2 | 7/2018 | Prager et al. | |
| 10,041,174 B2 | 8/2018 | Matsumoto et al. | |
| 10,042,407 B2 | 8/2018 | Grede et al. | |
| 10,063,062 B2 | 8/2018 | Voronin et al. | |
| 10,074,518 B2 | 9/2018 | Van Zyl | |
| 10,085,796 B2 | 10/2018 | Podany | |
| 10,090,191 B2 | 10/2018 | Tomura et al. | |
| 10,102,321 B2 * | 10/2018 | Povolny | G06F 30/367 |
| 10,109,461 B2 | 10/2018 | Yamada et al. | |
| 10,115,567 B2 | 10/2018 | Hirano et al. | |
| 10,115,568 B2 | 10/2018 | Kellogg et al. | |
| 10,176,970 B2 | 1/2019 | Nitschke | |
| 10,176,971 B2 | 1/2019 | Nagami | |

(56) References Cited

U.S. PATENT DOCUMENTS

| | | | |
|---|---|---|---|
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapinski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284246 A1* | 12/2007 | Keil .................. H01J 37/3299 |
| | | 204/298.36 |
| 2007/0284344 A1 | 12/2007 | Todorov et al. |
| 2007/0285869 A1 | 12/2007 | Howald |
| 2007/0297118 A1 | 12/2007 | Fujii |

(56) References Cited

U.S. PATENT DOCUMENTS

| | | |
|---|---|---|
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0018738 A1* | 1/2016 | Ohtsu .............. H01J 37/32972 216/41 |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0296806 A1* | 10/2017 | Cui ................... G01N 33/4836 |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |

(56) References Cited

U.S. PATENT DOCUMENTS

| | | | |
|---|---|---|---|
| 2018/0331655 A1 | 11/2018 | Prager et al. | |
| 2018/0350649 A1 | 12/2018 | Gomm | |
| 2018/0366305 A1 | 12/2018 | Nagami et al. | |
| 2018/0374672 A1 | 12/2018 | Hayashi et al. | |
| 2019/0027344 A1 | 1/2019 | Okunishi et al. | |
| 2019/0080884 A1 | 3/2019 | Ziemba et al. | |
| 2019/0090338 A1 | 3/2019 | Koh et al. | |
| 2019/0096633 A1 | 3/2019 | Pankratz et al. | |
| 2019/0157041 A1 | 5/2019 | Zyl et al. | |
| 2019/0157042 A1 | 5/2019 | Van Zyl et al. | |
| 2019/0157044 A1 | 5/2019 | Ziemba et al. | |
| 2019/0172685 A1 | 6/2019 | Van Zyl et al. | |
| 2019/0172688 A1 | 6/2019 | Ueda | |
| 2019/0180982 A1 | 6/2019 | Brouk et al. | |
| 2019/0198333 A1 | 6/2019 | Tokashiki | |
| 2019/0259562 A1 | 8/2019 | Dorf et al. | |
| 2019/0267218 A1 | 8/2019 | Wang et al. | |
| 2019/0277804 A1 | 9/2019 | Prager et al. | |
| 2019/0295769 A1 | 9/2019 | Prager et al. | |
| 2019/0295819 A1 | 9/2019 | Okunishi et al. | |
| 2019/0318918 A1 | 10/2019 | Saitoh et al. | |
| 2019/0333741 A1 | 10/2019 | Nagami et al. | |
| 2019/0341232 A1 | 11/2019 | Thokachichu et al. | |
| 2019/0348258 A1 | 11/2019 | Koh et al. | |
| 2019/0348263 A1 | 11/2019 | Okunishi | |
| 2019/0350072 A1* | 11/2019 | Dorf | C23C 14/3485 |
| 2019/0363388 A1 | 11/2019 | Esswein et al. | |
| 2019/0385822 A1 | 12/2019 | Marakhtanov et al. | |
| 2019/0393791 A1 | 12/2019 | Ziemba et al. | |
| 2020/0016109 A1 | 1/2020 | Feng et al. | |
| 2020/0020510 A1 | 1/2020 | Shoeb et al. | |
| 2020/0024330 A1 | 1/2020 | Chan-Hui et al. | |
| 2020/0035457 A1 | 1/2020 | Ziemba et al. | |
| 2020/0035458 A1 | 1/2020 | Ziemba et al. | |
| 2020/0035459 A1 | 1/2020 | Ziemba et al. | |
| 2020/0036367 A1 | 1/2020 | Slobodov et al. | |
| 2020/0037468 A1 | 1/2020 | Ziemba et al. | |
| 2020/0051785 A1 | 2/2020 | Miller et al. | |
| 2020/0051786 A1 | 2/2020 | Ziemba et al. | |
| 2020/0058475 A1 | 2/2020 | Engelstaedter et al. | |
| 2020/0066497 A1 | 2/2020 | Engelstaedter et al. | |
| 2020/0066498 A1 | 2/2020 | Engelstaedter et al. | |
| 2020/0075293 A1 | 3/2020 | Ventzek et al. | |
| 2020/0090905 A1 | 3/2020 | Brouk et al. | |
| 2020/0106137 A1 | 4/2020 | Murphy et al. | |
| 2020/0126760 A1 | 4/2020 | Ziemba et al. | |
| 2020/0126837 A1 | 4/2020 | Kuno et al. | |
| 2020/0144030 A1 | 5/2020 | Prager et al. | |
| 2020/0161091 A1 | 5/2020 | Ziemba et al. | |
| 2020/0161098 A1 | 5/2020 | Cui et al. | |
| 2020/0161155 A1 | 5/2020 | Rogers et al. | |
| 2020/0162061 A1 | 5/2020 | Prager et al. | |
| 2020/0168436 A1 | 5/2020 | Ziemba et al. | |
| 2020/0168437 A1 | 5/2020 | Ziemba et al. | |
| 2020/0176221 A1 | 6/2020 | Prager et al. | |
| 2020/0219706 A1 | 7/2020 | Koshimizu | |
| 2020/0227230 A1 | 7/2020 | Ziemba et al. | |
| 2020/0227289 A1 | 7/2020 | Song et al. | |
| 2020/0234922 A1 | 7/2020 | Dorf et al. | |
| 2020/0234923 A1* | 7/2020 | Dorf | H01J 37/32165 |
| 2020/0243303 A1 | 7/2020 | Mishra et al. | |
| 2020/0251371 A1 | 8/2020 | Kuno et al. | |
| 2020/0266022 A1 | 8/2020 | Dorf et al. | |
| 2020/0266035 A1 | 8/2020 | Nagaiwa | |
| 2020/0294770 A1 | 9/2020 | Kubota | |
| 2020/0304115 A1* | 9/2020 | Qu | H03K 5/135 |
| 2020/0328739 A1 | 10/2020 | Miller et al. | |
| 2020/0352017 A1 | 11/2020 | Dorf et al. | |
| 2020/0357607 A1 | 11/2020 | Ziemba et al. | |
| 2020/0373114 A1 | 11/2020 | Prager et al. | |
| 2020/0389126 A1 | 12/2020 | Prager et al. | |
| 2020/0407840 A1 | 12/2020 | Hayashi et al. | |
| 2020/0411286 A1 | 12/2020 | Koshimizu et al. | |
| 2021/0005428 A1 | 1/2021 | Shaw et al. | |
| 2021/0013006 A1 | 1/2021 | Nguyen et al. | |
| 2021/0013011 A1 | 1/2021 | Prager et al. | |
| 2021/0013874 A1 | 1/2021 | Miller et al. | |
| 2021/0027990 A1 | 1/2021 | Ziemba et al. | |
| 2021/0029815 A1 | 1/2021 | Bowman et al. | |
| 2021/0043472 A1 | 2/2021 | Koshimizu et al. | |
| 2021/0051792 A1 | 2/2021 | Dokan et al. | |
| 2021/0066042 A1 | 3/2021 | Ziemba et al. | |
| 2021/0082669 A1 | 3/2021 | Koshiishi et al. | |
| 2021/0091759 A1 | 3/2021 | Prager et al. | |
| 2021/0125812 A1 | 4/2021 | Ziemba et al. | |
| 2021/0130955 A1 | 5/2021 | Nagaike et al. | |
| 2021/0140044 A1 | 5/2021 | Nagaike et al. | |
| 2021/0151295 A1 | 5/2021 | Ziemba et al. | |
| 2021/0152163 A1 | 5/2021 | Miller et al. | |
| 2021/0210313 A1 | 7/2021 | Ziemba et al. | |
| 2021/0210315 A1 | 7/2021 | Ziemba et al. | |
| 2021/0249227 A1 | 8/2021 | Bowman et al. | |
| 2021/0272775 A1 | 9/2021 | Koshimizu | |
| 2021/0288582 A1 | 9/2021 | Ziemba et al. | |
| 2021/0351007 A1* | 11/2021 | Carter | H03K 3/64 |
| 2021/0408917 A1 | 12/2021 | Miller et al. | |
| 2022/0037121 A1 | 2/2022 | Dorf et al. | |
| 2022/0045608 A1* | 2/2022 | Bertolini | H02M 3/1588 |
| 2023/0260753 A1* | 8/2023 | Everts | H01J 37/32577 |
| | | | 315/111.21 |
| 2023/0280719 A1* | 9/2023 | Samuels | H01J 37/3299 |
| | | | 700/266 |
| 2023/0305045 A1* | 9/2023 | Gahan | G01R 19/28 |

FOREIGN PATENT DOCUMENTS

| | | |
|---|---|---|
| CN | 101707186 B | 2/2012 |
| CN | 105408993 A | 3/2016 |
| CN | 106206234 A | 12/2016 |
| CN | 104752134 B | 2/2017 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2016610 A1 | 1/2009 |
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |
| JP | 5018244 B2 | 9/2012 |
| JP | 2014112644 A | 6/2014 |
| JP | 2016-225439 A | 12/2016 |
| JP | 6741461 B2 | 8/2020 |
| JP | 2021503700 A | 2/2021 |
| KR | 100757347 B1 | 9/2007 |
| KR | 10-2007-0098556 A | 10/2007 |
| KR | 20160042429 A | 4/2016 |
| KR | 20200036947 A | 4/2020 |
| TW | 498706 B | 8/2002 |
| TW | 201436656 A | 9/2014 |
| TW | 201717247 A | 5/2017 |
| WO | 1998053116 A1 | 11/1998 |
| WO | 2000017920 A1 | 3/2000 |
| WO | 2000030147 A1 | 5/2000 |

(56)        References Cited

FOREIGN PATENT DOCUMENTS

| WO | 2000063459 | A1 | 10/2000 |
|---|---|---|---|
| WO | 2001005020 | A1 | 1/2001 |
| WO | 2001012873 | A1 | 2/2001 |
| WO | 2001013402 | A1 | 2/2001 |
| WO | 2002052628 | A1 | 7/2002 |
| WO | 2002054835 | A2 | 7/2002 |
| WO | 2002059954 | A1 | 8/2002 |
| WO | 2003037497 | A2 | 5/2003 |
| WO | 2003052882 | A2 | 6/2003 |
| WO | 2003054911 | A2 | 7/2003 |
| WO | 2003077414 | A2 | 9/2003 |
| WO | 2004084394 | A1 | 9/2004 |
| WO | 2005124844 | A1 | 12/2005 |
| WO | 2007118042 | A2 | 10/2007 |
| WO | 2008016747 | A2 | 2/2008 |
| WO | 2008050619 | A1 | 5/2008 |
| WO | 2008061775 | A1 | 5/2008 |
| WO | 2008061784 | A1 | 5/2008 |
| WO | 2008062663 | A1 | 5/2008 |
| WO | 2009012804 | A1 | 1/2009 |
| WO | 2009069670 | A1 | 6/2009 |
| WO | 2009111473 | A2 | 9/2009 |
| WO | 2011073093 | A1 | 6/2011 |
| WO | 2011087984 | A2 | 7/2011 |
| WO | 2011156055 | A1 | 12/2011 |
| WO | 2012030500 | A1 | 3/2012 |
| WO | 2012109159 | A1 | 8/2012 |
| WO | 2012122064 | A1 | 9/2012 |
| WO | 2013000918 | A1 | 1/2013 |
| WO | 2013016619 | A1 | 1/2013 |
| WO | 2013084459 | A1 | 6/2013 |
| WO | 2013088677 | A1 | 6/2013 |
| WO | 2013099133 | A1 | 7/2013 |
| WO | 2013114882 | A1 | 8/2013 |
| WO | 2013118660 | A1 | 8/2013 |
| WO | 2013125523 | A1 | 8/2013 |
| WO | 2013187218 | A1 | 12/2013 |
| WO | 2014035889 | A1 | 3/2014 |
| WO | 2014035894 | A1 | 3/2014 |
| WO | 2014035897 | A1 | 3/2014 |
| WO | 2014036000 | A1 | 3/2014 |
| WO | 2014124857 | A2 | 8/2014 |
| WO | 2014197145 | A1 | 12/2014 |
| WO | 2015060185 | A1 | 4/2015 |
| WO | 2014124857 | A3 | 5/2015 |
| WO | 2015134398 | A1 | 9/2015 |
| WO | 2015198854 | A1 | 12/2015 |
| WO | 2016002547 | A1 | 1/2016 |
| WO | 2016059207 | A1 | 4/2016 |
| WO | 2016060058 | A1 | 4/2016 |
| WO | 2016060063 | A1 | 4/2016 |
| WO | 2015073921 | A8 | 5/2016 |
| WO | 2016104098 | A1 | 6/2016 |
| WO | 2016128384 | A1 | 8/2016 |
| WO | 2016131061 | A1 | 8/2016 |
| WO | 2016170989 | A1 | 10/2016 |
| WO | 2017172536 | A1 | 10/2017 |
| WO | 2017208807 | A1 | 12/2017 |
| WO | 2018048925 | A1 | 3/2018 |
| WO | 2018111751 | A1 | 6/2018 |
| WO | 2018170010 | A1 | 9/2018 |
| WO | 2018197702 | A1 | 11/2018 |
| WO | 2018217349 | A1 | 11/2018 |
| WO | 2019036587 | A1 | 2/2019 |
| WO | 2019040949 | A1 | 2/2019 |
| WO | 2019099102 | A1 | 5/2019 |
| WO | 2019099870 | A1 | 5/2019 |
| WO | 2019185423 | A1 | 10/2019 |
| WO | 2019225184 | A1 | 11/2019 |
| WO | 2019239872 | A1 | 12/2019 |
| WO | 2019244697 | A1 | 12/2019 |
| WO | 2019244698 | A1 | 12/2019 |
| WO | 2019244734 | A1 | 12/2019 |
| WO | 2019245729 | A1 | 12/2019 |
| WO | 2020004048 | A1 | 1/2020 |
| WO | 2020017328 | A1 | 1/2020 |
| WO | 2020022318 | A1 | 1/2020 |
| WO | 2020022319 | A1 | 1/2020 |
| WO | 2020026802 | A1 | 2/2020 |
| WO | 2020033931 | A1 | 2/2020 |
| WO | 2020036806 | A1 | 2/2020 |
| WO | 2020037331 | A1 | 2/2020 |
| WO | 2020046561 | A1 | 3/2020 |
| WO | 2020051064 | A1 | 3/2020 |
| WO | 2020112921 | A1 | 6/2020 |
| WO | 2020121819 | A1 | 6/2020 |
| WO | 2020145051 | A1 | 7/2020 |
| WO | 2021003319 | A1 | 1/2021 |
| WO | 2021062223 | A1 | 4/2021 |
| WO | 2021097459 | A1 | 5/2021 |
| WO | 2021134000 | A1 | 7/2021 |

OTHER PUBLICATIONS

U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Taiwan Office Action for 108132682 dated Mar. 24, 2022.
Wang, S.B., et al.—"Control of ion energy distribution at substrates during plasma processing, " Journal of Applied Physics, vol. 88, No. 2, Jul. 15, 2000, pp. 643-646.
Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.
Eagle Harbor Technologies webpage—"In Situ Testing of EHT Integrators on a Tokamak," 2015, 1 page.
Eagle Harbor Technologies webpage—High Gain and Frequency Ultra-Stable Integrators for Long Pulse and/or High Current Applications, 2018, 1 page.
Eagle Harbor Technologies webpage—"EHT Integrator Demonstration at DIII-D," 2015, 1 page.
Eagle Harbor Technologies webpage—"High Gain and Frequency Ultra-Stable Integrators for ICC and Long Pulse ITER Applications," 2012, 1 page.
Eagle Harbor Technologies webpage—"Long-Pulse Integrator Testing with DIII-D Magnetic Diagnostics," 2016, 1 page.
Sunstone Circuits—"Eagle Harbor Tech Case Study," date unknown, 4 pages.
Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.
Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.
Semiconductor Components Industries, LLC (SCILLC)—"Switch-Mode Power Supply" Reference Manual, SMPSRM/D, Rev. 4, Apr. 2014, ON Semiconductor, 73 pages.
PCT International Search Report and Written Opinion dated Nov. 9, 2018, for International Application No. PCT/US2018/043032.
Taiwan Office Action for Application No. 107125613 dated Dec. 24, 2020, 16 pages.
PCT International Search Report and Written Opinion dated Nov. 7, 2018, for International Application No. PCT/US2018/042965.
International Search Report and Written Opinion for PCT/US2019/052067 dated Jan. 21, 2020.
Electrical 4 U webpage—"Clamping Circuit," Aug. 29, 2018, 9 pages.
Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.
PCT Notification of Transmittal of the International Search Report and the Written Opinion of the International Searching Authority for

(56) References Cited

OTHER PUBLICATIONS

International Application No. PCT/US2019/048392; dated Dec. 16, 2019; 13 pages.
PCT International Search Report and Written Opinion dated Nov. 7, 2018, for International Application No. PCT/US2018/042961.
PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function (IEDF) Using Shaped- Pulse (EV) Bias; by Leonid Dorf, et al.; filed Dec. 16, 2016; 22 total pages.
U.S. Appl. No. 15/424,405; entitled System for Tunable Workpiece Biasing in a Plasma Reactor, by Travis Koh, et al.; filed Feb. 3, 2017; 29 total pages.
U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.
Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
PCT/US2020/014453 Interanational Search Report and Written Opinion dated May 14, 2020 consists of 8 pages.
S.B. Wang et al. "Ion Bombardment Energy and SiO 2/Si Fluoro-carbon Plasma Etch Selectivity", Journal of Vacuum Science & Technology A 19, 2425 (2001).
Korean Office Action for 10-2020-7007495 dated Jun. 14, 2021.
Zhen-hua Bi et al., A brief review of dual-frequency capacitively coupled discharges, Current Applied Physics, vol. 11, Issue 5, Supplement, 2011, pp. S2-S8.

Chang, Bingdong, "Oblique angled plasma etching for 3D silicon structures with wiggling geometries" 31(8), [085301]. https://doi. org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B.S., M.S, "RF Plasma Etching With A DC Bias" A Dissertation in Physics. Dec. 1994.
Michael A. Lieberman, "Principles of Plasma Discharges and Material Processing", A Wiley Interscience Publication. 1994.
Yiting Zhang et al. "Investigation of feature orientation and consequences of ion tilting during plasma etching with a three-dimensional feature profile simulator", Nov. 22, 2016.
Richard Barnett et al. A New Plasma Source for Next Generation MEMS Deep Si Etching: Minimal Tilt, Improved Profile Uniformity and Higher Etch Rates, SPP Process Technology Systems. 2010.
The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
U.S. Appl. No. 17/361,178, filed Jun. 28, 2021.
S.B. Wang et al. "Ion Bombardment Energy and SiO 2/Si Fluoro-carbon Plasma Etch Selectivity", Journal of Vacuum Science & Technology A 19, 2425 (2001).
Taiwan Office Action issued to patent application No. 111150106 on Jul. 7, 2025.
Korean Office Action issued to patent application No. 10-2025-7007521 on Sep. 24, 2025.

* cited by examiner

300

DELIVERING A FIRST WAVEFORM
WITH AN ASSOCIATED SETPOINT — 302

DETECTING AT LEAST ONE
CHARACTERISTIC OF THE WAVEFORM — 304

ESTIMATING A VOLTAGE DECAY DURING A PORTION
OF A PULSE DURING THE FIRST WAVEFORM — 306

CALCULATING A COMPENSATION FACTOR — 308

APPLYING THE COMPENSATION FACTOR TO CORRECT FOR
THE VOLTAGE DECAY WITHIN A SUBSEQUENT WAVEFORM — 310

TIME (µS)

TIME (µS)

PULSED VOLTAGE COMPENSATION FOR PLASMA PROCESSING APPLICATIONS

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably forming high aspect ratio features is one of the key technology challenges for manufacturing the next generation of semiconductor devices. High aspect ratio openings used to form the features are typically formed using a plasma-assisted etch process, such as a reactive ion etch (RIE) process capable of directionally controlled (i.e., anisotropic) material removal to transfer a pattern from a mask layer to exposed portions of the substrate surface there beneath. As feature sizes continue to shrink and pattern density continues to increase, the degree of anisotropy and within-substrate processing uniformity of the RIE process are critical factors in forming closely spaced (fine pitched) high aspect ratio openings.

For etching processes where the plasma ions play a major role, ion energy control is always challenging the semiconductor equipment industry. In a typical plasma-assisted etching process, the substrate is positioned on an electrostatic chuck (ESC) disposed in a processing chamber, a plasma is formed over the substrate, and ions are accelerated from the plasma towards the substrate across a plasma sheath, i.e., region depleted of electrons, formed between the plasma and the surface of the substrate. Traditionally, radio frequency (RF) substrate biasing methods, which use sinusoidal RF waveforms to excite the plasma and form the plasma sheath, have been unable to desirably form these smaller device feature sizes. Recently, it has been found that the delivery of high voltage direct current (DC) pulses to one or more electrodes within a processing chamber can be useful in desirably controlling the plasma sheath formed over the surface of the substrate.

During the plasma processing of a substrate, the voltage pulse will typically be configured to generally include a sheath collapse stage, an ion current stage, and a sheath formation stage that is disposed between the sheath collapse stage and an ion current stage. The sheath collapse stage may be implemented by generating a positive voltage (e.g., 100 volts) to be used to collapse a sheath generated over a surface of the substrate disposed on a substrate support positioned in a processing chamber. During the ion current stage, ions within the processing chamber flow to the surface of the substrate due to a generated negative voltage (e.g., −1600 volts) that is applied to an electrode disposed adjacent to the substrate. The ion current stage may be accompanied by an associated voltage decay, also often referred to as "droop," in the voltage pulse established on the substrate during this stage, which may cause a generally undesirable ion energy distribution function (IEDF). The amount of voltage decay that occurs during plasma processing may vary due to a number of factors, which include chamber pressure variance, process chemistry variance, and the applied voltage and source power.

Accordingly, there is a need in the art for apparatus and methods that provide improved control over characteristics of a plasma sheath formed over a substrate during the plasma-assisted processing of the substrate.

SUMMARY

Embodiments herein provide plasma processing chambers and methods configured for fine-tuning and control over a plasma sheath formed during the plasma-assisted processing of a semiconductor substrate.

Some embodiments are directed to a method for waveform generation. The method generally includes delivering a first waveform with an associated setpoint from an energy source; detecting at least one characteristic of the first waveform using at least one sensor; determining a voltage decay value during a portion of a pulse during the first waveform by using the detected at least one characteristic and at least one stored voltage decay value function; determining a sheath coupling voltage value during the portion of the pulse of the first waveform by using the detected at least one characteristic and at least one stored sheath coupling voltage value function; calculating a compensation factor based on the determined voltage decay value and the determined sheath coupling voltage value; and adjusting the at least one characteristic using the compensation factor.

Some embodiments are directed to a method for waveform generation, comprising: delivering a first waveform with an associated setpoint from an energy source; detecting at least one characteristic of the first waveform using at least one sensor; determining a voltage decay value during a portion of a pulse provided within the first waveform by use of the detected at least one characteristic and at least one stored voltage decay value function; determining a sheath coupling voltage value during the portion of the pulse of the first waveform by use of the detected at least one characteristic and at least one stored sheath coupling voltage value function; calculating a compensation factor based on the determined voltage decay value and the determined sheath coupling voltage value; and adjusting at least one characteristic of the first waveform by applying the calculated compensation factor to the at least one characteristic of the first waveform.

Some embodiments are directed to a waveform generator. The waveform generator generally includes a sensor assembly coupled to the output of the pulser, wherein the sensor assembly comprises at least one sensor configured to detect at least one characteristic of a first waveform generated by the waveform generator; and a system controller coupled to the waveform generator. The system controller generally includes a processor and memory, wherein the memory includes instructions which when executed by the processor causes: an amount of voltage decay within a portion of a pulse during the first waveform to be determined using at least one stored voltage decay value formulation; an amount of a sheath coupling voltage within the portion of a pulse of the first waveform to be determined using at least one stored sheath coupling voltage value formulation; a compensation factor based on the determined amount of voltage decay and the determined amount of sheath coupling voltage to be calculated; and the at least one characteristic to be adjusted using the compensation factor to adjust a voltage decay.

Some embodiments are directed to a waveform generator, comprising: a sensor assembly coupled to an output of a pulser, wherein the sensor assembly comprises at least one sensor configured to detect at least one characteristic of a first waveform generated by the waveform generator; and a system controller coupled to the waveform generator. The system controller comprises: a processor and memory, wherein the memory includes instructions which when executed by the processor causes: an amount of voltage decay within a portion of a pulse during the first waveform to be determined using at least one stored voltage decay value function; an amount of a sheath coupling voltage within the portion of a pulse of the first waveform to be determined using at least one stored sheath coupling voltage value function; a compensation factor based on the determined amount of voltage decay and the determined amount of sheath coupling voltage to be calculated; and the at least one characteristic of the first waveform to be adjusted based on the application of the calculated compensation factor.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Certain aspects of the present disclosure are generally directed to techniques for generating a compensated voltage waveform for a plasma processing system. During the plasma processing of a substrate, the voltage waveform, which is provided to an electrode disposed within a plasma processing chamber, will typically be configured to include a sheath collapse stage and an ion current stage. The sheath collapse stage may be implemented by generating a positive voltage (e.g., 100 volts) to be used to collapse a plasma sheath generated over a surface of the substrate disposed on a substrate support positioned in a processing chamber. During the ion current stage, ions within a plasma formed in the processing chamber begin to flow to a surface of the substrate due to a negative voltage (e.g., >1000 volts) that is created by the application of a pulse voltage waveform to an electrode disposed adjacent to the substrate. The ion current stage may be accompanied by an associated voltage decay, or "droop," which will typically cause an undesirable energy distribution function (IEDF) at the surface of the substrate. The amount of voltage decay that occurs during plasma processing may vary due to a number of factors, which include chamber pressure variance, process chemistry variance, and the applied voltage and source power. Due to the variance of the voltage decay between plasma processing chambers and processing systems as plasma processing recipes vary, there is a need to account for the voltage decay during plasma processing and to compensate for the decay accordingly.

In aspects of the current disclosure, a waveform generator may use a ramp during the ion current stage of a pulse to implement voltage compensation to narrow the IEDF, as described in more detail herein. The compensated voltage waveform can be generated by applying a calculated compensation factor to a waveform generated by a pulsed voltage source to correct for the voltage decay that is established on the substrate during plasma processing.

Plasma Processing System Example

Figure 1:
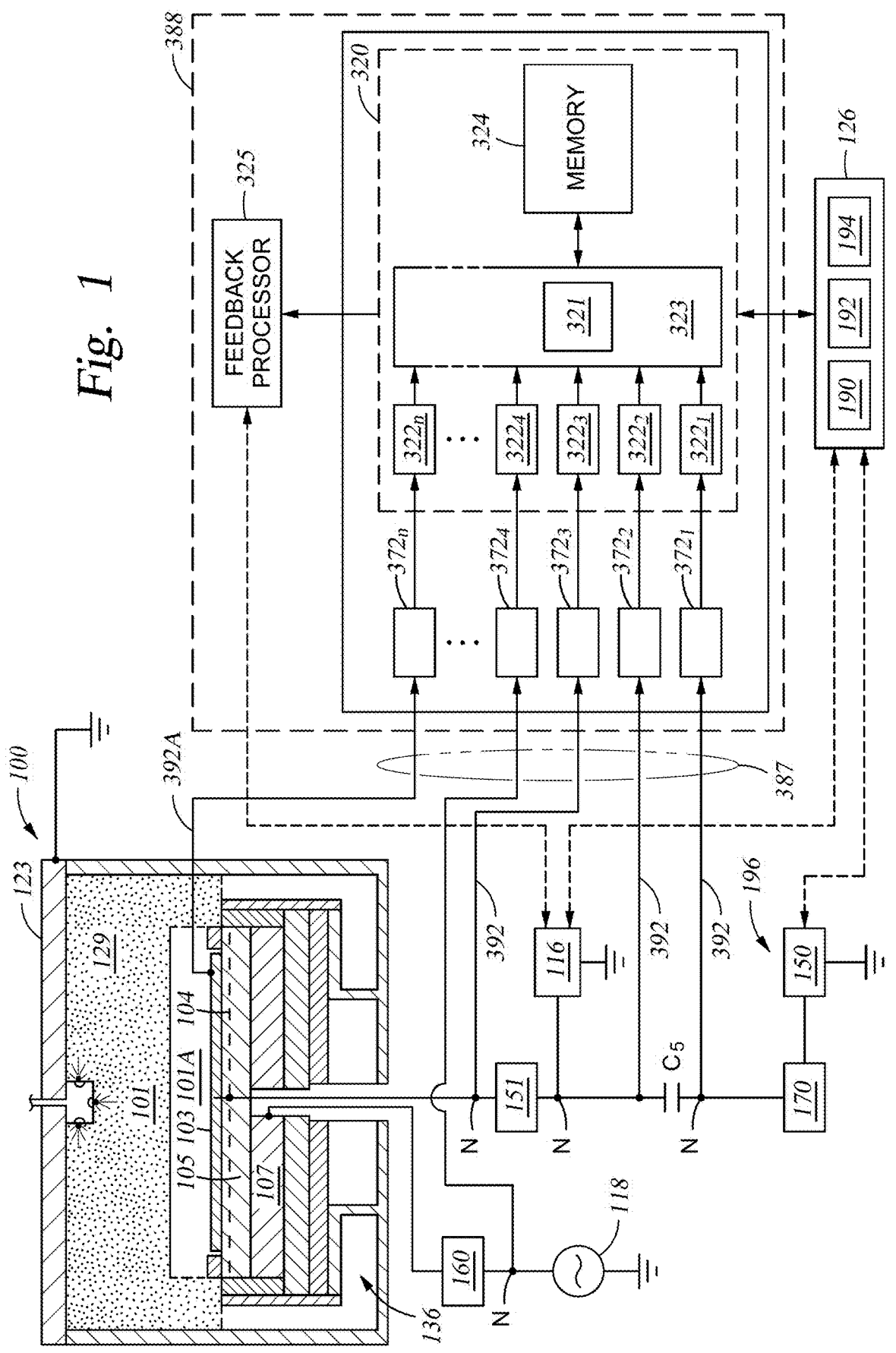
FIG. 1 is a simplified schematic cross-sectional view of a processing system and a signal detection module, in accordance with certain embodiments of the present disclosure.

FIG. 1 is a simplified schematic cross-sectional view of a processing system and a signal detection module, in accordance with certain embodiments of the present disclosure. In some embodiments, the processing system is configured for plasma-assisted etching processes, such as a reactive ion etch (RIE) plasma processing. However, it should be noted that the embodiments described herein may be also be used with processing systems configured for use in other plasma-assisted processes, such as plasma enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system includes a processing chamber 100 and a signal detection module 388 that may be used to monitor and control characteristics of a plasma sheath 101a during substrate processing. The processing chamber 100 includes the signal detection module 388, a support assembly 136, and a bias module 198. The bias module 198 can include one or more pulse voltage (PV)

waveform generators 150 and/or one or more RF generator assemblies 118. The support assembly 136 includes a support base 107 and a substrate support 105 disposed on and thermally coupled to a support base 107. As shown, the processing chamber 100 is configured to generate a capacitively coupled plasma by delivering a radio frequency (RF) signal to the support base 107 from the RF power supply 118. However, it is contemplated that the signal detection module 388 can be used with any number of processing chambers, support assemblies, and bias modules in order to facilitate monitoring and control over the plasma sheath 101a during substrate processing.

Here, electrical signals that can be used to determine one or more characteristics of the plasma sheath 101a are received by the signal detection module 388, which then communicates information relating to the electrical signals to the system controller 126 for use in controlling aspects of the plasma process. The system controller 126 may include a processor 190, a memory 192, and a support circuit 194. The processor 190 may be a general-purpose computer processor configured for use in an industrial setting for controlling the processing chamber and sub-processors related thereto. The memory 192, which is generally non-volatile memory, may include random access memory, read-only memory, floppy or hard disk drive, or other suitable forms of digital storage, local or remote. The support circuits 194 are conventionally coupled to the processor 190 and comprise a cache, clock circuits, input/output subsystems, power supplies, and the like, and combinations thereof. Software instructions (program) and data can be coded and stored within the memory 192 for instructing the processor 190. A software program (or computer instructions) readable by processor 190 in the system controller 126 determines which tasks are performable by the components in the processing system.

Typically, the program, which is readable by processor 190 in the system controller 126, may be stored in the memory 192, and includes code, which, when executed by the processor 190, performs tasks relating to the plasma processing schemes described herein. The program may include computer implemented instructions that are used to control the various hardware and electrical components within the processing system to perform the various process tasks and various process sequences used to implement the methods described herein. In one embodiment, the program includes instructions that are used to perform one or more of the operations described below in relation to FIG. 3.

Typically, the system controller 126 determines, based on the information received from the signal detection module 388, one or more characteristics of the plasma sheath 101a and compares the determined sheath characteristics to desired sheath characteristics. Based on the difference between the determined sheath characteristics to desired sheath characteristics, the system controller 126 may use the sheath compensation scheme described herein to adjust the one or more sheath characteristics, e.g., by changing a configuration of one or more of the pulsed voltage (PV) waveforms established at the bias electrode 104. For example, the system controller 126 may cause the PV waveform generator 150 to change one or more characteristics of a pulsed voltage waveform delivered to the bias electrode 104. In some embodiments, a second PV waveform generator 150 (not shown) is coupled to an edge electrode (not shown) and thus is configured to deliver one or more of the PV waveforms to the edge electrode. In this configuration, the system controller 126 may also cause the second PV waveform generator 150 to change one or more characteristics of a pulsed voltage waveform delivered to the edge electrode during plasma processing.

In some embodiments, the RF generator assembly 118 delivers an RF signal to the support base 107 (e.g., power electrode or cathode) which may be used to generate (maintain and/or ignite) a plasma 101 in a processing region 129 disposed between the substrate support assembly 136 and the chamber lid 123. In some embodiments, the RF generator 118 is configured to deliver an RF signal having a frequency that is greater than 1 MHz or more, or about 2 MHz or more, such as about 13.56 MHz or more, to the support base 107.

In some embodiments, an RF generator 118 and an RF generator assembly 160 are configured to deliver a desired amount of a continuous wave (CW) or pulsed RF power, often referred to herein as the "source power," at a desired substantially fixed sinusoidal waveform frequency to a support base 107 of the substrate support assembly 136 based on control signals provided from the system controller 126. During processing, the RF generator 118 and an RF generator assembly 160 are configured to deliver RF power (e.g., an RF signal) to the support base 107 disposed proximate to the substrate support 105, and within the substrate support assembly 136. The RF power delivered to the support base 107 is configured to ignite and maintain a plasma 101 containing the processing gases disposed within a processing region 129. In some embodiments, the RF generator assembly 118 may alternately be configured to deliver the RF signal to the chamber lid 123 to ignite and maintain a plasma 101 containing the processing gases disposed within a processing region 129.

FIG. 1 shows electrical connections between the signal detection module 388 and nodes N, connection points, and bias electrode 104, a first PV module 196, and an electrostatic chuck clamping network 116. To reduce visual clutter only one PV waveform generator 150 is illustrated in FIG. 1, however it should be noted that in embodiments herein, the signal detection module 388 is configured to receive electrical signals through electrical connections to nodes N, connection points, and elements within the bias module 198. A capacitor $C_5$ is placed between a first set of nodes N. Another sensor assembly 151 is also placed between a second set of nodes N.

As shown, the signal detection module 388 is electrically coupled to individual electrical components found within the processing chamber 100 by use of a plurality of signal lines 387. The plurality of signal lines 387 include multiple signal traces 392 that are coupled to various electrical components within the processing chamber 100 and are configured to deliver electrical signals to signal detection elements found within the signal detection module 388. In general, the signal detection module 388 includes one or more input channels 372 and a fast data acquisition module 320. The one or more input channels 372 are each configured to receive electrical signals from a signal trace 392 and are electrically coupled to the fast data acquisition module 320. The received electrical signals can include one or more characteristics of waveforms established by the PV waveform generator 150 and/or the RF power supply 118.

The fast data acquisition module 320 includes one or more acquisition channels 322 that receive signal information from the individual components of the processing chamber 100 via the signal lines 387 and the one or more input lines. The fast data acquisition module 320 processes the received signal information to determine one or more characteristics of the waveforms generated by the bias module and communicates the processed signal information to the system controller 126.

Generally, the signal detection module 388 includes multiple input channels 372 that are each electrically coupled to a corresponding acquisition channel 322 of the fast data acquisition module 320. As shown in FIG. 1, the multiple input channels 372 are coupled to connection points that are positioned in various parts of the bias module 198 and the clamping network 116 to measure and collect electrical data from these connection points or nodes N during processing. In some embodiments, the multiple input channels 372 may also be coupled to various electrical sensing elements, such as one or more current sensors, which are configured to measure and collect electrical data at various points within the processing chamber 100.

Here, the fast data acquisition module 320 includes a plurality of acquisition channels 322, the data acquisition controller 323, and memory 324 (e.g., non-volatile memory). The data acquisition controller 323 is electrically coupled to an output of each of the acquisition channels 322 and is configured to receive the digitized voltage waveform from each of the acquisition channels 322. Further, algorithms stored within the memory 324 of the data acquisition controller 323 are adapted to determine one or more waveform characteristics of each of the waveforms by analyzing each of the digitized voltage waveforms. The analysis may include a comparison of information received in the digitized voltage waveform with information relating to one or more stored waveform characteristics that are stored in memory 324, as discussed further below.

The data acquisition controller 323 can include one or more of an analog-to-digital converter (ADC) (not shown), a processor 321, a communication interface (not shown), a clock (not shown), and an optional driver (not shown). The processor may be any general computing processor. Further, the processor may be a Field Programmable Gate Array (FPGA). The ADC converts the signal within the output waveforms from the analog domain to the digital domain, and the output digital signal of the ADC is provided to the processor 321 for processing. The processor 321 determines the one or more waveform characteristics of the output waveform by analyzing the output digital signal provided from the ADC.

The memory 324 may be any non-volatile memory. The data acquisition controller 323 may be electrically coupled with the memory 324 and is configured to cause waveform characteristics to be stored within the memory 324. In various embodiments, the memory 324 includes instructions executable by the data acquisition controller 323 to cause the data acquisition controller 323 to analyze the received output waveforms and/or transmit information corresponding to determined waveform characteristics based on the analysis of the received output waveforms. A waveform analyzer stored in memory 324 includes instructions executable by the data acquisition controller 323 and when executed, causes the data acquisition controller 323 to analyze the output waveforms to determine the waveform characteristics.

Information relating to the analyzed waveform characteristics can then be transmitted to one or more of a feedback processor 325 and/or the system controller 126. The analysis performed by the data acquisition controller 323 can include a comparison of the waveform characteristics and one or more waveform characteristic threshold values stored in memory 324. In some embodiments, the analysis is based on one or more electrical characteristics of the processing chamber 100 that are known and stored in memory.

In some embodiments of the process chamber 100, a sensor assembly 170 is disposed between the PV waveform generator 150 and one or more of the bias electrode 104. The sensor assembly 170 includes a current sensor, which may be an in-line current sensor or be disposed within the PV waveform generator 150.

Generally, PV waveforms generated by the PV waveform generator 150 are configured to provide a nearly constant sheath voltage during a substantial portion of the PV waveform cycle (e.g., "ion current stage" in FIG. 2) that, in combination with the sheath thickness, enables the formation of a desirable ion energy distribution function (IEDF) at the surface of the substrate 103. As described in the methods below the ability to compensate the PV waveforms to account for the voltage decay at the bias electrode 104 enables fine-tuning, control, and tailoring of processing results across the surface of the substrate 103.

During processing, a plurality of PV waveforms are provided to the bias electrode 104, and eventually to a complex load within the processing chamber 100, by the PV waveform generator 150 of the bias module 198. The overall control of the delivery of the PV waveforms from the PV waveform generator 150 is controlled by use of signals provided from the signal detection module 388 and/or the system controller 126 as discussed below.

Example Voltage Waveform

Figure 2:
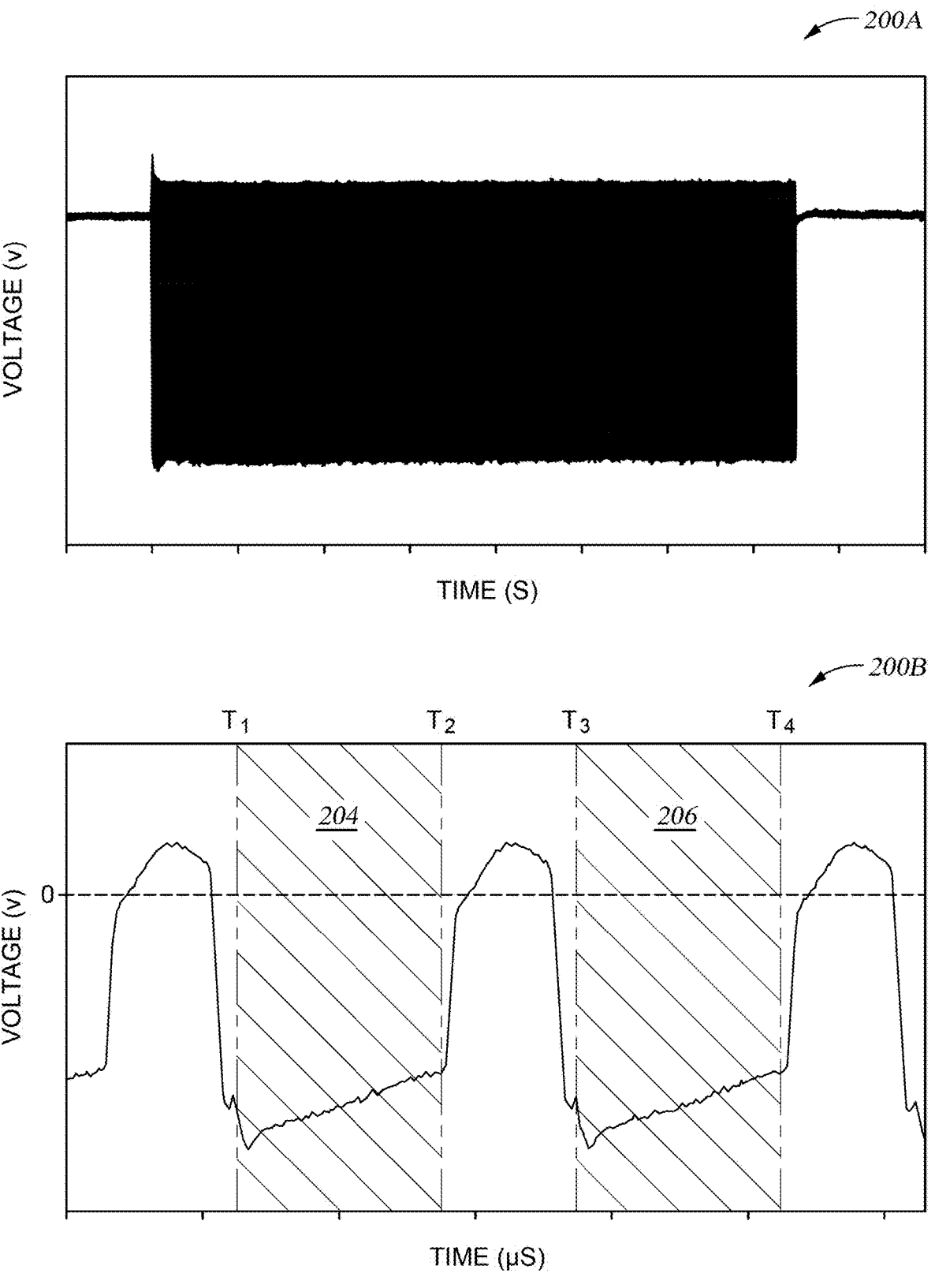
FIG. 2 illustrates an example of an under compensated voltage waveform established on a substrate, in accordance with certain embodiments of the present disclosure.

FIG. 2 illustrates an example of an under compensated voltage waveform established on a substrate during plasma processing, in accordance with certain embodiments of the present disclosure. In some embodiments, waveforms may be given as bursts instead of being continually applied during the performance of a plasma processing process performed on the substrate. The burst of pulses 200A is an example of a single burst of pulses established at the substrate 103 due to the delivery of a voltage waveform to the bias electrode 104 by the PV waveform generator 150. In some embodiments, the substrate 103 may be a wired version of a substrate 103, being referred to herein as a "wired wafer." The wired wafer can be used to detect one or more characteristics of a waveform and plasma characteristics established on the wafer during plasma processing. In some embodiments, the wired wafer can be coupled to the signal detection module 388 via a wiring 392A so that information relating to one or more plasma processing characteristics (e.g., substrate voltage) can be determined within a plasma processing chamber, as shown in FIG. 1. The waveform 200B illustrates an example of two pulses, and portions of adjacent pulses on either side of the two pulses, generated within a portion of the burst of pulses 200A. In some embodiments, the waveform 200B is a PV waveform that includes a first portion (e.g., 204 portion between $T_1$ and $T_2$, and a 206 portion between $T_3$ and $T_4$) within each pulse that includes a positive slope (e.g., voltage per unit time), which relates to a "droop" in the voltage established on the substrate. The positive slope is formed on the substrate during the ion current stage of the PV waveform. The portions 204, 206 of the waveform 200B illustrate examples of under compensated voltage waveforms established on a substrate, which were measured by use of a wired wafer. A voltage decay step count, or staircase like ramp, includes a number of steps (e.g., steps) that are applied to the PV waveform at a fixed step voltage to form a negative voltage ramp that is used to compensate for the positive voltage ramp created by the voltage decay or droop. A voltage decay step count may not have been applied to the waveform 200B, and the waveform 200B may not be compensated.

In some embodiments, the portions 204, 206 of the waveform 200B in FIG. 2 represent example sampling windows used by the signal detection module 388 to detect and or determine characteristics of the "droop" within the voltage waveform established on the substrate 103 due to the voltage waveform generated by the PV waveform generator 150. In one example, the sampling window includes between about 50% and about 90% of a 400 kHz pulsed waveform. Several parameters may affect the 400 kHz "droop", including plasma density/species, the baseline pulse voltage (PV) setpoint, temperature), and PV on-time. Several parameters may affect burst shape/spread, including burst on-time, source L2L pulsing.

The pulses within the waveform 200B generally includes two main stages: an ion current stage and a sheath collapse stage. Both the ion current stage and the sheath collapse stage portions of the waveform, which are established at the substrate 103, are shown in FIG. 2. At the beginning of the ion current stage, a drop in voltage at the substrate 103 is created, due to the delivery of a negative portion of a PV waveform (e.g., ion current portion) provided to the bias electrode 104 by the PV waveform generator 150, which creates a high voltage sheath above the substrate 103. The high voltage sheath allows the plasma generated positive ions to be accelerated towards the biased substrate. As more positive ions bombard the surface of the substrate, an amount of positive charge builds up on the surface of the substrate 103 over time. The increase in positive charge on the substrate's surface gradually increases the voltage of the substrate, or "substrate potential," and thus creates the "droop." As seen in FIG. 2, the voltage of the waveform 200B gradually and undesirably increases from a more negative voltage at the beginning of the ion current stage to a less negative voltage during the latter portion of the ion current stage. If uncontrolled, the gradual accumulation of positive charge on the surface of the substrate results in the gradual discharge of the high voltage sheath and chuck capacitance, slowly decreasing the sheath voltage and bringing the substrate potential closer to zero. The voltage difference between the beginning and end of the ion current stage determines the width of an ion energy distribution function (IEDF). The greater the difference in voltage, the wider the IEDF width, which is undesirable for a number of reasons, making reliably forming high aspect ratio features more difficult.

Processing Monitoring and Control Examples

Figure 3:
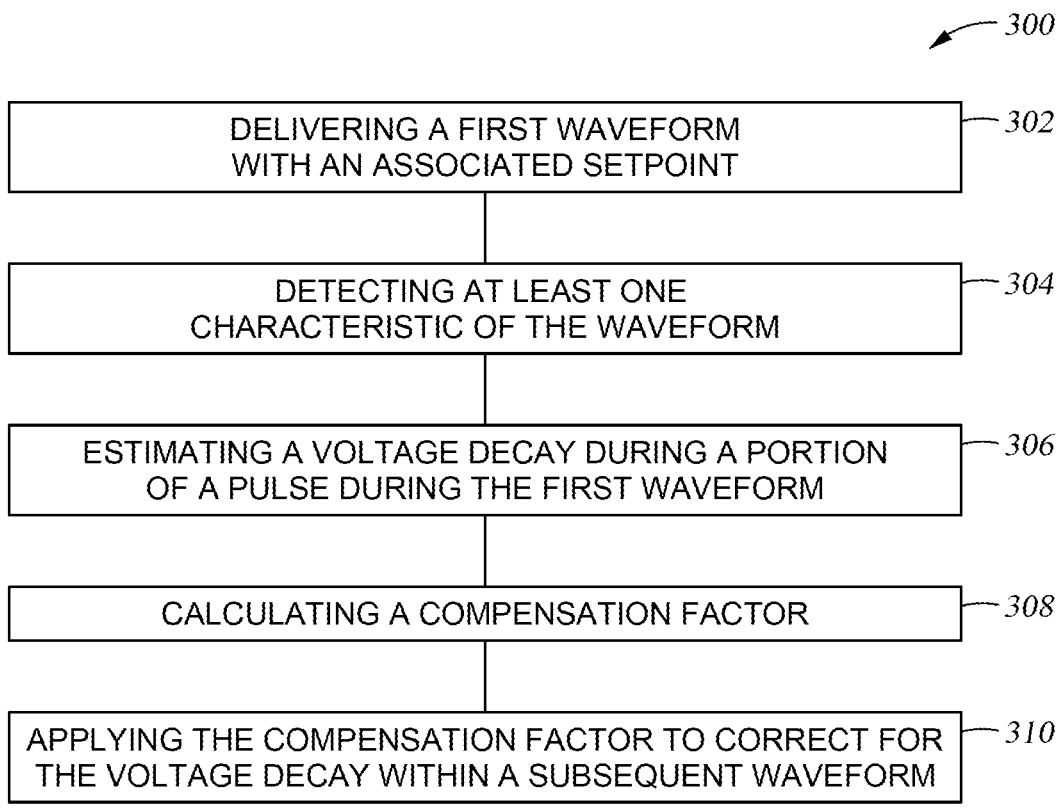
FIG. 3 is a process flow diagram illustrating a method of waveform generation, in accordance with certain embodiments of the present disclosure.

FIG. 3 is a process flow diagram illustrating a method 300 of waveform generation, in accordance with certain embodiments of the present disclosure. The blocks of the method 300 may be performed by use of a system controller 126, as described above. The method 300 may allow the waveform generator 150 to compensate for the voltage decay seen on a substrate 103, as is illustrated in the voltage waveform example illustrated in FIG. 4. The method 300 includes delivering a first waveform with an associated setpoint to an electrode within a process chamber, detecting at least one characteristic of the delivered first waveform, estimating a voltage decay during a portion of a pulse during the delivery of the first waveform to the electrode, calculating a compensation factor, and applying the compensation factor to correct for the voltage decay within a subsequent waveform that is delivered to the electrode.

Figure 4:
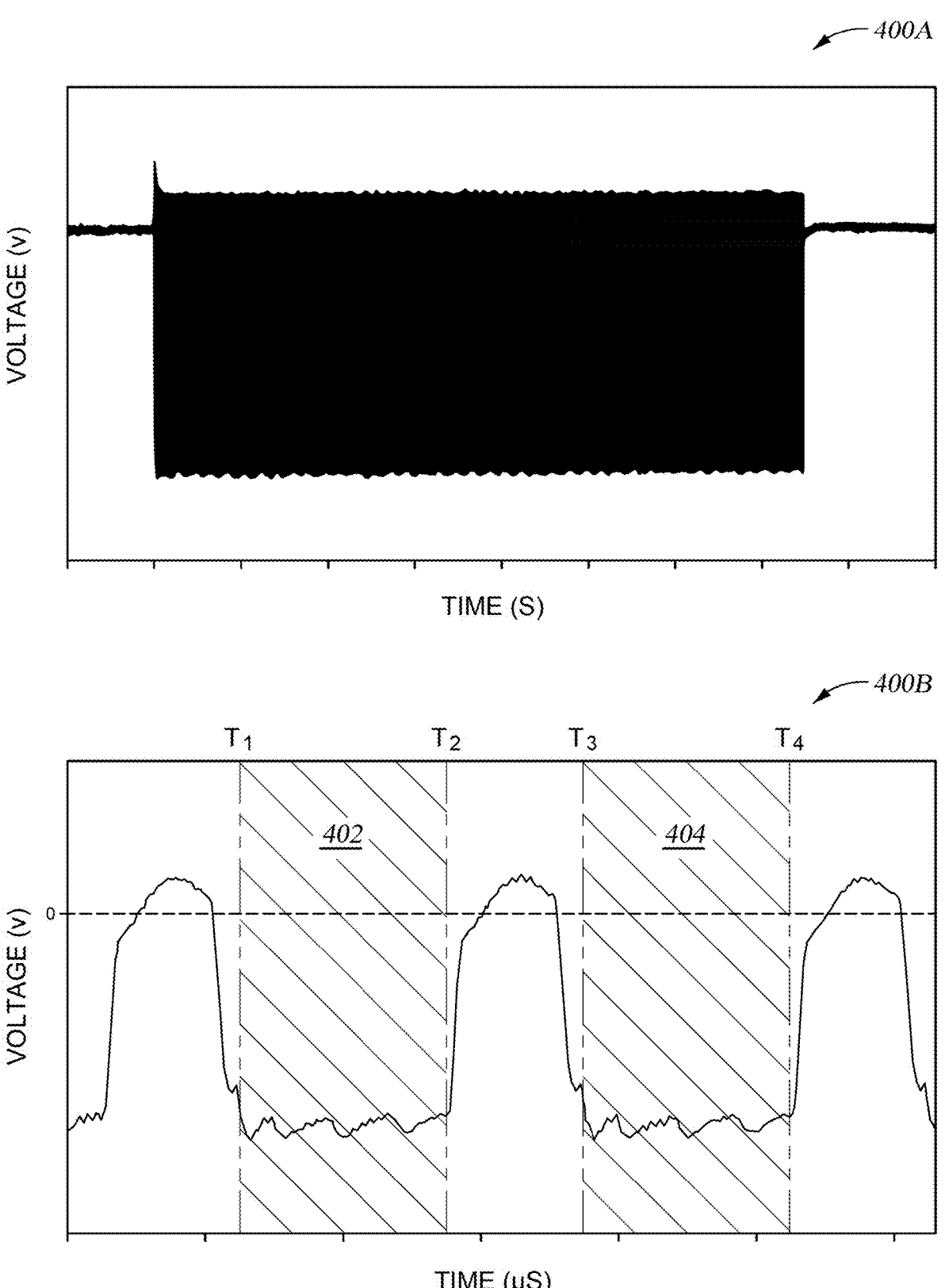
FIG. 4 illustrates an example of a compensated voltage waveform established on a substrate, in accordance with certain embodiments of the present disclosure.

FIG. 4 illustrates an example of a compensated voltage waveform established on a substrate 103 due to the delivery of a voltage waveform to an electrode (e.g., bias electrode 104) disposed adjacent to a substrate, in accordance with certain embodiments of the present disclosure. The burst of pulses 400A is an example of a burst of pulses of the compensated voltage waveform that is established at the substrate, which can be measured by use of a wired wafer. The waveform 400B illustrates an example of two pulses, and portions of adjacent pulses on either side of the two pulses, formed within the burst of pulses 400A. In some embodiments, the compensated voltage waveform illustrated by waveform 400B has a region 402 or region 404 within each pulse that has been adjusted in order to compensate for a voltage decay similar to the voltage decay illustrated in the waveform 200B.

To achieve monoenergetic ions and a narrower IEDF width during the ion current stage of the voltage waveform established at the substrate, operations are performed to compensate for the changing substrate potential during the ion current stage and create a substantially flat shaped region (e.g., near zero slope) of the established voltage waveform experienced by the substrate during plasma processing. An example of a voltage waveform experienced by the substrate during plasma processing is illustrated by the ion current stage portion of the waveform 400B in FIG. 4. To establish the substantially flat shaped region in the voltage waveform established at the substrate, a waveform that includes a negative slope during the ion current stage (i.e., ion current portion found in FIG. 4) can be delivered to the bias electrode 104 by the PV waveform generator 150. Driving, and or implementing the negative voltage slope at the bias electrode 104 is also known as current compensation, which can be created by use of a current source that is coupled to the bias electrode 104. The negative voltage slope implemented during ion current portion of the waveform 400B are created by increasing the amount of electrons provided to the bias electrode 104 by the PV waveform generator 150 to cancel the otherwise increasing field caused by the accumulating positive charges due to the incoming ions striking the substrate during plasma processing. Therefore, by determining the slope (dV/dt) of the voltage waveform established at the substrate 103, by use of the methods described herein, the system controller 126 can adjust the current provided by a current source and/or alter the characteristics of the PV waveform generated by the energy source (e.g., PV waveform generator 150) to thereby maintain a constant sheath potential throughout the ion current stage of the waveform established at the substrate 103. In some embodiments, a direct current (DC) supply current is used for implementing a ramp that has a desired slope during the ion current stage.

At block 302, a first waveform with an associated setpoint is delivered from an energy source (e.g., PV waveform generator 150) to an electrode. In some embodiments, the first waveform may be a high voltage pulse waveform, and the first waveform may establish a plasma sheath 101a. The associated setpoint may be a baseline process, that includes a waveform voltage setpoint during one or more stages of the delivery of a waveform (e.g., waveform 400B) to the electrode, a process pressure setpoint, an RF power setpoint, and a substrate temperature setpoint, and may include a PV waveform on-time setpoint (e.g., length of the ion current stage of the waveform).

At block 304, a sensor (e.g., current sensor in sensor assembly 170) may detect at least one characteristic of the first waveform generated by the PV waveform generator 150. The at least one characteristic may be the magnitude of a current detected by a current sensor (e.g., current transformer reading taken from the sensor). In some embodiments, the sensor may be an in-line sensor disposed between the energy source (e.g., PV waveform generator 150) and a bias electrode 104.

At block 306, a voltage decay during a portion of a pulse formed during the delivery of the first waveform may be estimated. Estimating the voltage decay may optionally include determining a voltage decay value during a portion of a pulse formed within the first waveform by using the detected at least one characteristic and at least one stored voltage decay value function stored in memory 192 of the system controller 126, and determining a sheath coupling voltage value during the portion of the pulse of the first waveform by using the detected at least one characteristic and at least one stored sheath coupling voltage value function. The sheath coupling voltage value is an empirically determined value that represents the capacitive coupling between the wired wafer and a biased electrode due to the delivery of voltage waveform to the electrode from an energy source (e.g., PV waveform generator 150). It is believed that the sheath coupling voltage value will vary as a function of one or more plasma processing parameters, which may include but are not limited to the magnitude of the applied voltage delivered during a pulse, process pressure and characteristics of the hardware in the processing chamber (e.g., capacitance of the dielectric layer disposed between the substrate and electrode). The sheath coupling voltage value can be determined, for each process chamber within a multi-chamber plasma processing system, by the system controller by use of an empirically derived function, or table of values, that were pre-determined by taking measurements on a previously processed substrate during plasma processing within a process chamber. In some embodiments, the measurements are made by use of a wired wafer that is able to at least detect a voltage established on the substrate during a plasma processing recipe performed in a process chamber.

In some embodiments of the method 300, the stored voltage decay value function and stored sheath coupling voltage value function may both have been previously determined and/or programed and stored in memory 192, and thus may be retrieved from memory 192 for use in estimating and correcting for the voltage decay that would be experienced by a substrate during the performance of a plasma processing recipe performed in a process chamber. In some embodiments of the method 300, the stored voltage decay value function and stored sheath coupling voltage value function may be determined using a wired wafer, as will be discussed below. The stored voltage decay value function and stored sheath coupling voltage value function may each include one value, or may each include more than one value. The stored voltage decay value function and stored sheath coupling voltage value function may each form a library or repository of data associated with multiple process conditions and recipes for a given processing chamber.

Figure 5A:
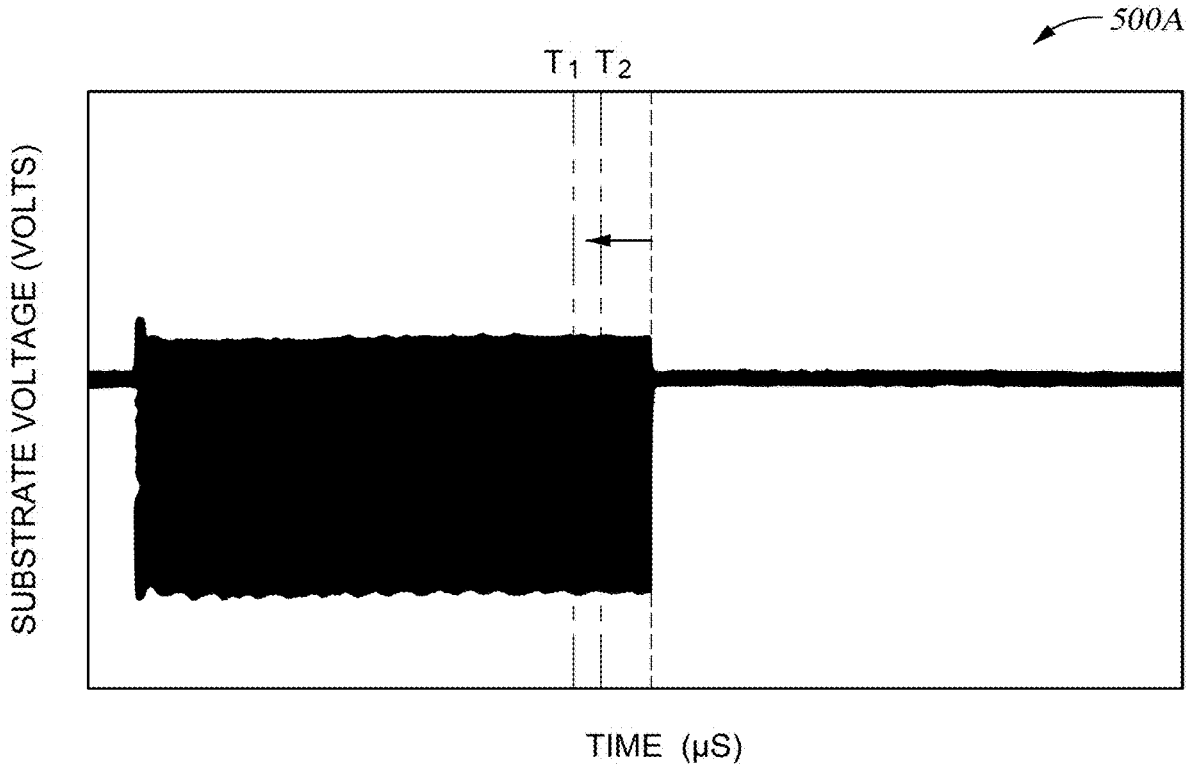
FIG. 5A illustrates a curve representing a detected voltage pulse formed within a burst of pulses of a voltage waveform and a curve representing a plot of a portion of the voltage detected during the burst of pulses, in accordance with certain embodiments of the present disclosure.
Figure 5A:
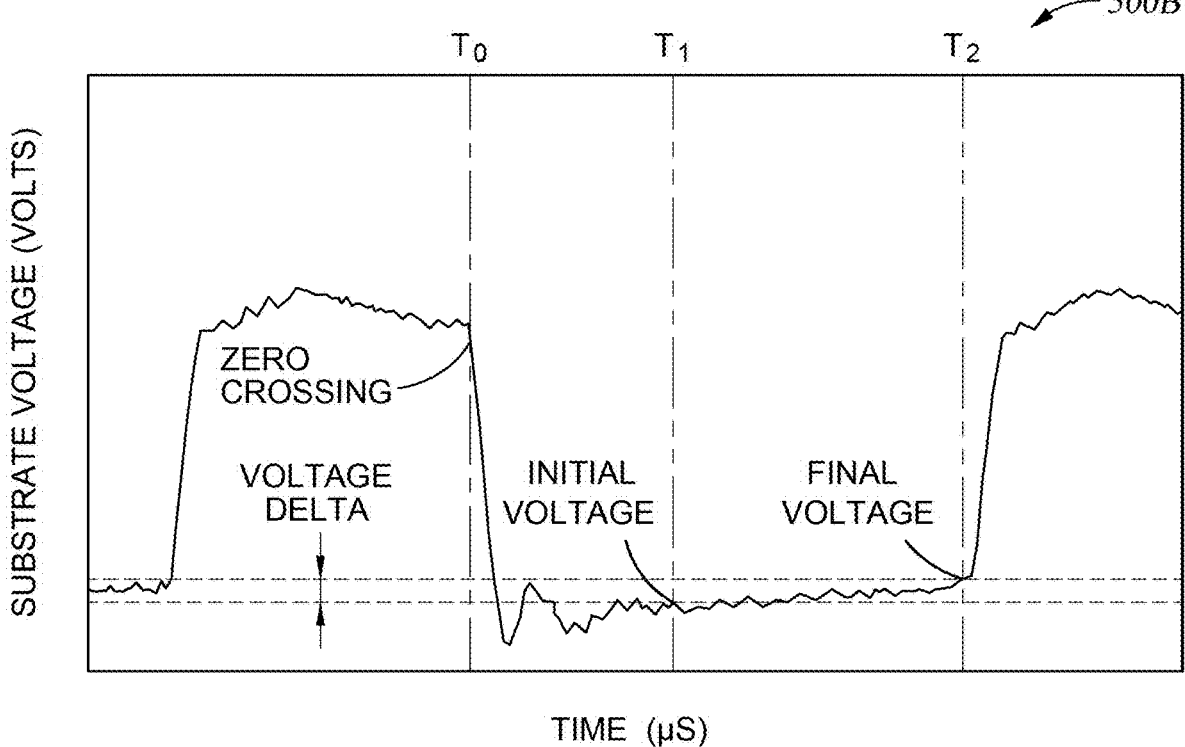
Figure 5B:
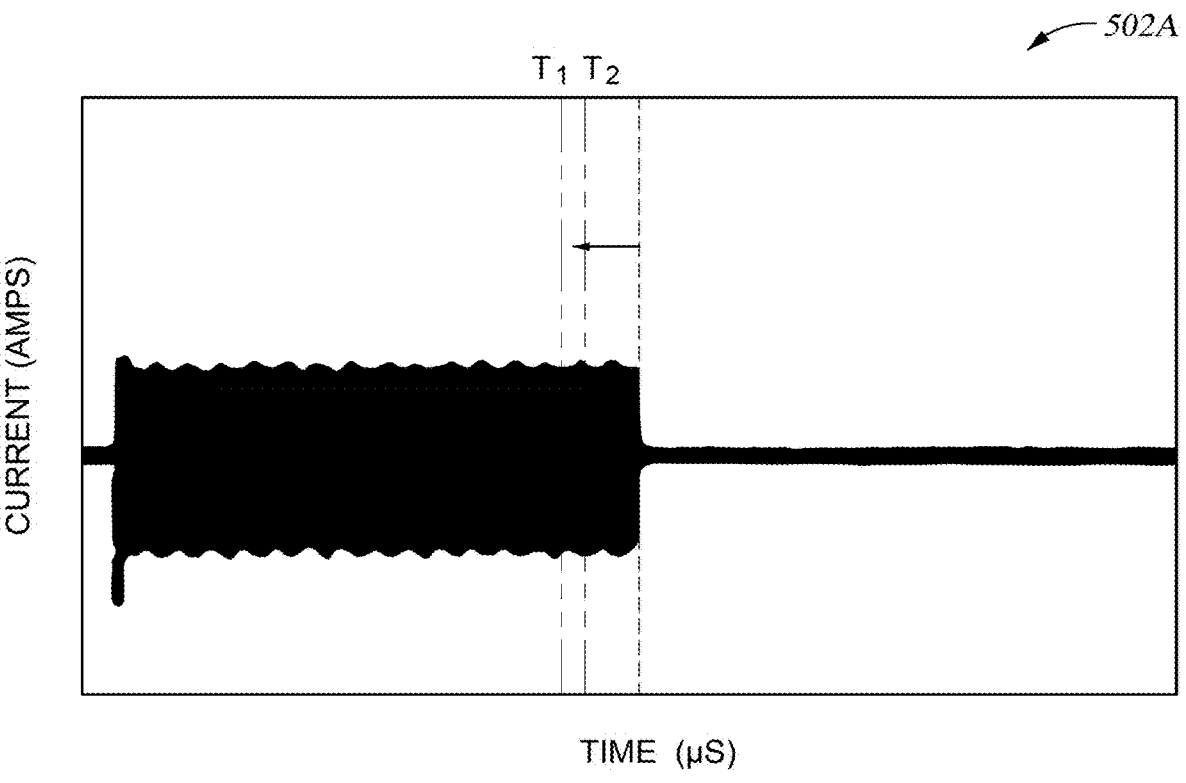
FIG. 5B illustrates a curve representing a current detected during the delivery of the voltage pulse formed within the burst of pulses of the voltage waveform of FIG. 5A and a curve representing a plot of the current detected during the portion of the burst of pulses of FIG. 5A, in accordance with certain embodiments of the present disclosure.
Figure 5B:
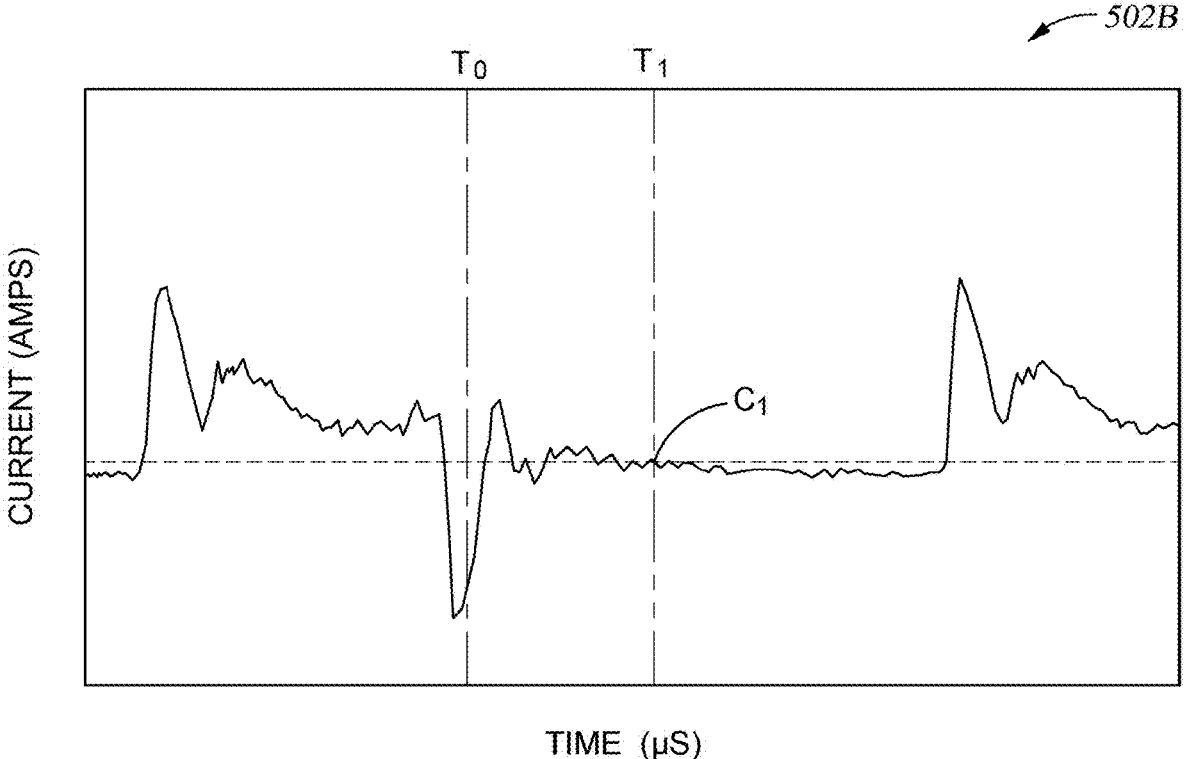

FIGS. 5A and 5B illustrate characteristics of a pulse of a voltage waveform established on a substrate 103 by use of a wired wafer and a sensing element found within the sensor assembly 170, in accordance with certain embodiments of the present disclosure. The burst of pulses 500A and 502A are examples of two different measurements used to characterize the electrical properties of a burst of pulses established at a substrate 103. The burst of pulses 500A includes a detected varying established voltage formed on a substrate due to the delivery of the voltage waveform within the burst of pulses to an electrode (e.g., bias electrode 104) by the PV waveform generator 150. The burst of pulses 502A includes a detected varying current flowing between the electrode and PV waveform generator 150 due to the delivery of the voltage waveform within the burst of voltage pulses to the electrode by the PV waveform generator 150. The waveform 500B (FIG. 5A) illustrates a time varying voltage measured during a portion of a pulse formed within the detected burst of pulses 500A, and the waveform 502B (FIG. 5B) illustrates a time varying current measured during the portion of the pulse formed within the detected burst of pulses 502A. In some embodiments, the waveform 500B is measured on a substrate 103 by use of a wired wafer. In some embodiments, it is desirable to perform similar measurements in each process chamber within a plasma processing system to characterize the actual electrical characteristics for each process chamber. In other embodiments, it is desirable to perform measurements in one process chamber within a plasma processing system and then utilize the measured electrical characteristics for that process chamber as the representative electrical characteristics for the other process chambers in the plasma processing system.

The method 300 may optionally include creating a function involving at least one voltage decay value and a function used to determine at least one sheath coupling voltage associated with a substrate during a plasma process. In some embodiments, the method 300 may include detecting an initial voltage value and a final voltage value established on a substrate 103 during a portion of a pulse (e.g., waveform 500B in FIG. 5A) of the burst of pulses (e.g., burst of pulses 500A in FIG. 5A) generated during a plasma process to determine at least one voltage decay value. The at least one voltage decay value can be detected by use of one or more sensing elements that are coupled to one or more voltage sensing elements coupled to the substrate 103. The portion of a pulse of the voltage waveform may be an interval of time (e.g., between $T_1$ and $T_2$) within the pulse of the waveform 500B, and may correspond to a part of or the entirety of the ion current stage of the waveform 500B. In some embodiments, the portion of a pulse of the waveform may be chosen in order to avoid transition times for the pulse, such as the transition between the sheath collapse stage and the ion current stage (e.g., portion of the ion current stage just before time $T_1$ in FIG. 5A). For example, as shown in FIG. 5A, the portion of the pulse that is measured begins a short time after the beginning of the ion current phase, which is generally defined after the sheath formation stage of the voltage pulse has occurred (i.e., vertical drop just before the start of the ion current stage). In some embodiments, the initial voltage value during the ion current stage is a function of the voltage waveform setpoint set by the PV waveform generator 150. The method 300 may also include determining the voltage delta value (before time $T_0$) during a portion of a pulse by use of the established initial voltage value and final voltage value measured voltage on a substrate 103 (e.g., final voltage minus initial voltage).

The method 300 may optionally include detecting at least one measured current value (e.g., $C_1$) during a portion of a pulse of the waveform 502B (FIG. 5B) by use of a sensor (e.g., current sensor in sensor assembly 170) that is configured to detect a current flowing between the PV waveform generator 150 and bias electrode 104. The portion of a pulse of the waveform may be measured at an initial point in time (e.g., $T_1$ before $T_0$) within the waveform 502B, and may correspond to the beginning of the ion current stage of the waveform 502B. In some embodiments, the current sensor may be an in-line sensor disposed between the energy source (e.g., PV waveform generator 150) and a bias electrode 104, or a sensor disposed within the power delivery circuitry within the energy source.

Figure 6A:
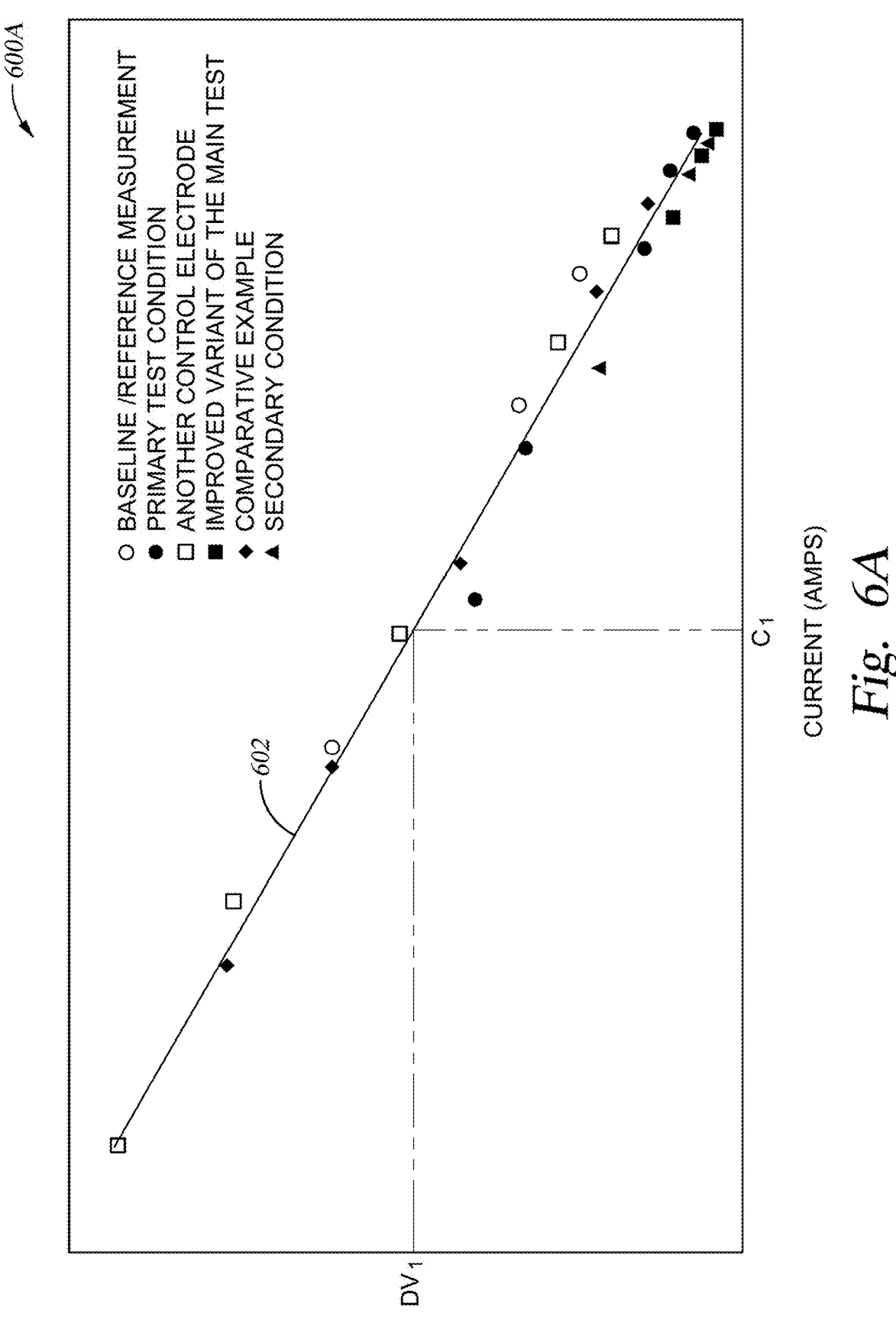
FIG. 6A illustrates a voltage decay value curve for a waveform, in accordance with certain embodiments of the present disclosure.

The method 300 may optionally include storing a plurality of voltage decay values that are a function of a generated measured current value (e.g., $C_1$). As illustrated in FIG. 6A, the stored plurality of voltage decay values can be used to form a curve 602 that represents a change in voltage (i.e., droop) on the substrate as a function of detected measured current value (e.g., $C_1$) during a portion of the ion current stage of the voltage waveform. The voltage decay values can be predetermined by measuring, by use of a wired wafer, the actual amount of voltage change (i.e., droop) in the voltage established on a substrate at a plurality of detected measured current values within a processing chamber at different plasma processing conditions, such as different pulse voltage biasing levels applied to the electrode by the PV waveform generator.

Figure 6B:
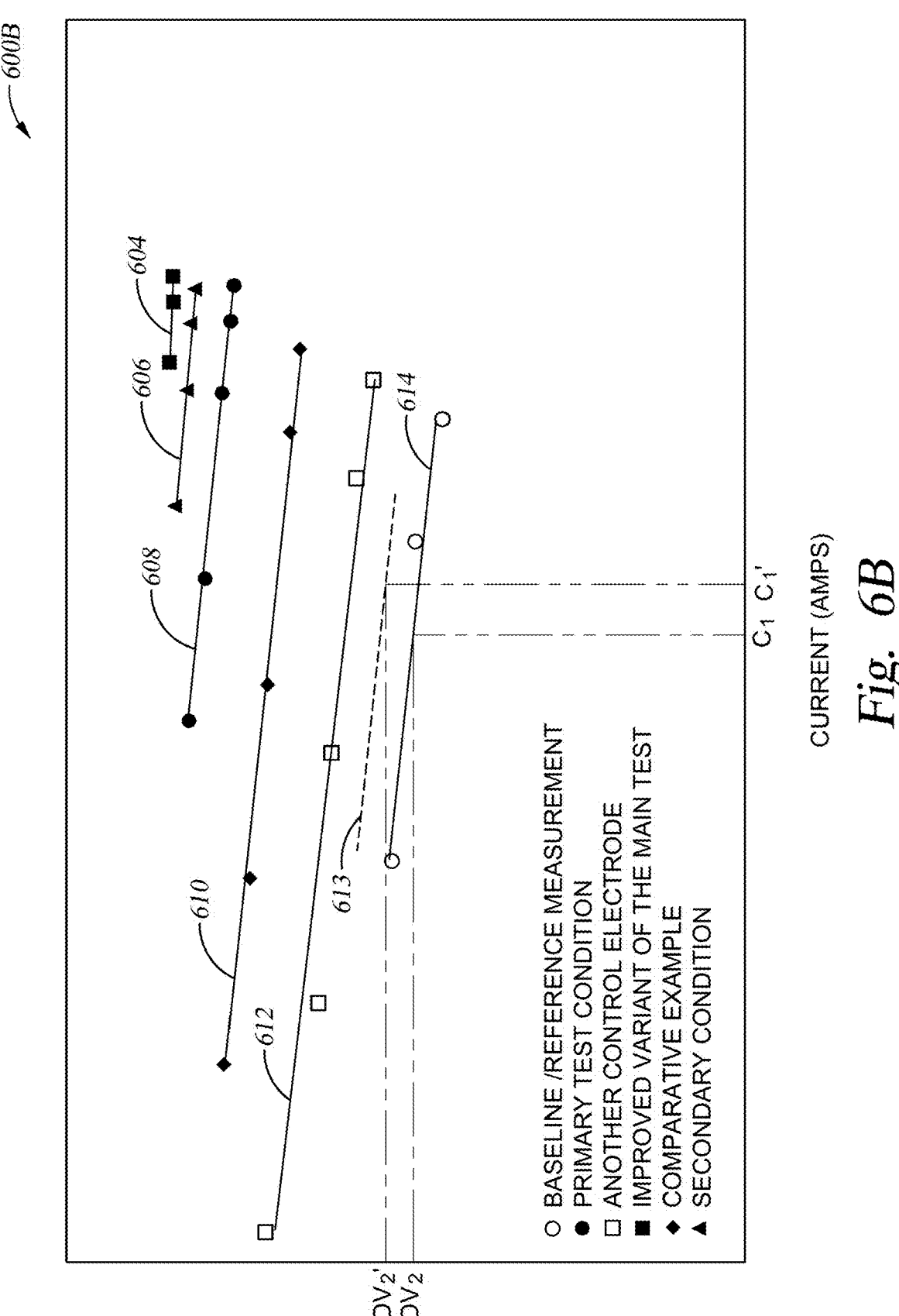
FIG. 6B illustrates a plurality of plasma sheath coupling curves, in accordance with certain embodiments of the present disclosure.

In some embodiments, the method 300 may include storing a plurality of sheath coupling values in memory. The sheath coupling values represent the relationship in capacitive coupling between a substrate and the biasing electrode when a voltage waveform is applied to an electrode (e.g., bias electrode) by the PV waveform generator 150. The sheath coupling values are a measure of the difference in a voltage established on a substrate relative to a voltage applied to the electrode at an instant in time at a measured current value (e.g., $C_1$ measured at $T_1$ in FIG. 5B). It has been found that sheath coupling values will vary as a function of the measured current value and the magnitude of the voltage applied to the electrode (e.g., initial voltage measured at time $T_1$). The generated initial voltage value is a function of the PV setpoint. For example, each curve (e.g., 604, 606, 608, 610, 612, 614) in FIG. 6B is associated with a different PV setpoint. The sheath coupling values can be determined by measuring voltage on a wired wafer, comparing the measured voltage with a voltage delivered to an electrode, and also noting a generated measured current value (e.g., $C_1$) at the same instant in time. One will note that the measured current value $C_1$ is based on or affected by the plasma processing chamber's response to the applied PV setpoint and the applied source power used to generate the plasma.

The voltage decay values and the sheath coupling values may be stored, for example, in a memory 192 of a system controller 126. The at least one voltage decay value and the at least one sheath coupling value may be stored, for example, in the form of a table, graph, equation, or any other available means for recording a relationship. For example, FIGS. 6A and 6B illustrate examples representing voltage decay values and sheath coupling values associated with measurements of a waveform as measured on a substrate 103 (e.g., voltage delta, measured current value), in accordance with certain embodiments of the present disclosure.

In FIG. 6A, graph 600A illustrates the relationship (e.g., voltage droop) between a voltage decay value (i.e., slope of voltage during ion current stage (dV/dt)) and a measured current value (e.g., $C_1$). In some embodiments, determining a voltage decay value during a portion of a pulse during the first waveform (see block 306) includes finding a matching value detected characteristic of a first waveform, such as the measured current value on the graph 600A, or current $C_1$, and then finding the corresponding voltage decay value (e.g., $DV_1$) based on the relationship set by curve 602. As noted above, the voltage decay values, which are stored in memory 192 as a function of the measured current value, can be stored in a table, graph or equation so that, when compared with the measured current value $C_1$, a voltage decay value $DV_1$ can be determined. In general, the single voltage decay value is a measure of the rate of the projected decay (i.e., droop) in the substrate voltage during the ion current phase of a voltage pulse based on a measured current value. In some embodiments, the determined voltage decay value $DV_1$ can be used directly during the subsequent compensation factor determination activity (block 308). In some other embodiments, based on the determined voltage decay value $DV_1$, a voltage delta ($\Delta V$) can be determined by multiplying the determined voltage decay value $DV_1$ by a known length of the ion current stage in which the measured current value $C_1$ was measured. The length of the ion current stage is associated with the PV on-time of a voltage pulse.

In FIG. 6B, graph 600B is illustrates a relationship between an initial voltage and a measured current value (current_i) for various PV setpoints used to find a sheath coupling voltage value. Each of the curves 604, 606, 608, 610, 612, and 614 represent a single PV setpoint, and thus a sheath coupling voltage value (i.e., Y-axis) can be determined by knowledge of measured current value (i.e., X-axis) at a known PV setpoint. In the example illustrated in FIG. 6B, one will note that the magnitude of the PV setpoint (e.g., magnitude of the ion current voltage during the ion current stage) used to generate curves 604, 606, 608, 610, 612, and 614 decrease in magnitude from curve 604 to curve 614. In one example, a sheath coupling voltage value during the portion of the pulse of the first waveform (see block 306) can be determined by detecting a measured current value $C_1$ (amps) and finding the corresponding sheath coupling value $DV_2$ (volts) using a known PV setpoint illustrated by the curve 614 in the sheath coupling graph 600B. As noted above, the sheath coupling values, which are stored in memory 192 as a function of the measured current value, can be stored in a table, graph or equation such that when compared with the measured current value $C_1$ a single sheath coupling value can be determined. In some embodiments, multiple different sets of curves, such as two or more sets of curves 604, 606, 608, 610, 612, and 614, may be stored in memory and used and/or selected based on an adjustment of one or more different plasma processing parameters, such a source power, percentage on-time of the PV pulse, pulse frequency or other plasma processing parameter that will affect the sheath coupling values.

In some plasma processing processes performed on a substrate, it is desirable to adjust the PV setpoint to achieve a desired voltage on a substrate during the ion current phase of an applied PV pulse. In some cases, the actual desired PV setpoint needed to achieve a desired voltage and process result may not coincide with one of the generated curves 604, 606, 608, 610, 612, and 614, which are stored in memory and utilized to determine the sheath coupling value $DV_2$ (volts). In some embodiments, as illustrated in FIG. 6B, it is desirable to adjust the PV setpoint to a value that falls between two known curves, such as curves 612 and 614, to achieve a desired process result on a substrate during a plasma process performed thereon. The new PV setpoint is illustrated in FIG. 6B as the curve 613, which can be determined by interpolating at a measured current value $C_1'$ a point between the two known curves 612 and 614. Therefore, by use of the measured current value $C_1'$ (FIG. 6B) at the new PV setpoint and finding an interpolated PV setpoint value by use of the system controller 126 a new sheath coupling value $DV_2'$ (FIG. 6B) can be determined. Using this technique a new sheath coupling value $DV_2'$ can be determined for any desired PV setpoint.

At block 308, a compensation factor may be calculated based on the determined voltage delta ($\Delta V$) determined from the voltage decay value $DV_1$ and the determined sheath coupling value $DV_2$. The compensation factor is calculated based on the voltage delta ($\Delta V$) and a determined sheath coupling voltage value $DV_2$ is determined from information received by the detection of the measured current value $C_1$ during one or more pulses within a generated waveform. In some embodiments, the compensation factor is used to adjust the magnitude of the voltage applied during the ion current stage as a function of time based on the expected slope determined from the voltage decay value $DV_1$ and expected offset in voltage determined from the sheath coupling value $DV_2$. For example, FIG. 4, as described above, illustrates an example of an optimally compensated voltage waveform (e.g., 402, 404) established on a substrate 103, through the implementation of a voltage decay stepcount.

Figure 7:
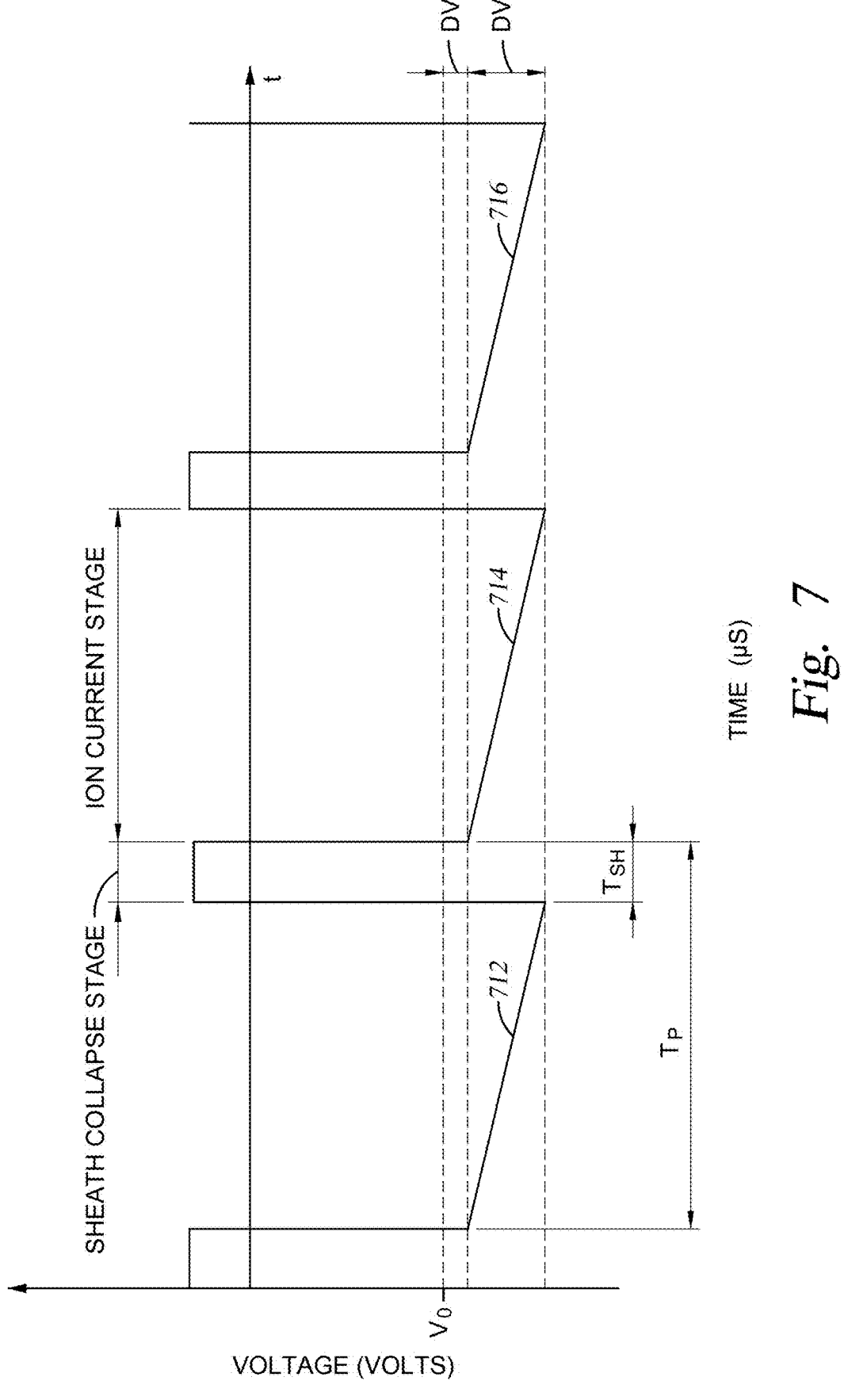
FIG. 7 shows an example compensation factor as applied to a voltage waveform.

FIG. 7 shows an example of an effect of applying a compensation factor determined in block 308 to a voltage waveform that is applied to an electrode, such as the bias electrode 104 shown in FIG. 1 by use of the system controller 126. The waveform example shown in FIG. 7 generally includes two main stages, an ion current stage and a sheath collapse stage/ion neutralization stage that is applied to an electrode. At the beginning of the ion current stage, a drop in the applied voltage establishes a high voltage sheath above the substrate, which causes the positive ions formed in a plasma to flow to the surface of the substrate 103. As discussed previously, the charging of surface of substrate due to flow of the positive ions to the substrate surface generates the voltage droop.

Therefore, by applying the compensation factor determined in block 308 the slope of the waveform established on the substrate during the ion current stage can be adjust so that it is zero or close to zero to improve the ion energy distribution function (IEDF) created during the plasma process. An example, of compensated waveform is shown in FIG. 4B. The compensated portion of a voltage waveform that is delivered from the power supply (e.g., waveform generator 150) to the bias electrode 104 may include the portions of the waveform represented by lines 712, 714, 716 in FIG. 7.

In some embodiments, calculating the compensation factor involves using the voltage delta ($\Delta V$) and the determined sheath coupling voltage value $DV_2$, along with the a known PV on-time found within a pulse of a voltage waveform. In some embodiments, the PV setpoint on-time of a waveform is stored in a memory 192, and may be used, along with the determined voltage decay value $DV_1$ and sheath coupling voltage value $DV_2$ to calculate the compensation factor. The determined sheath coupling voltage value $DV_2$ sets the offset in the voltage established at the substrate 103 during plasma processing, which as shown in FIG. 7, for example, includes an increased drop in voltage (e.g., more negative) an amount equal to the magnitude of sheath coupling voltage value $DV_2$ from the original voltage drop ($V_0$) formed during the sheath formation stage used in a prior pulse. For example, the sheath coupling voltage value $DV_2$ can be applied to an initial applied voltage $V_0$ generated by the power supply to shift the voltage to a compensated voltage value (e.g., $V_0+DV_2$) to enable a more optimized negative voltage to be applied at the start of the ion current phase. The voltage decay value $DV_1$ is also multiplied by the PV setpoint on-time value (seconds) to determine the voltage delta ($\Delta V$) compensation required over the length of the PV on-time (e.g., the necessary slope of the curves 712, 714, 716) to enable a more optimized IEDF that compensates for the voltage decay (e.g., droop). Thus, in some cases, the compensation factor will include the amount of correction created by the determination of the sheath coupling voltage value $DV_2$ and the determined the voltage delta ($\Delta V$) derived from the determined voltage decay value $DV_1$.

While the voltage delta ($\Delta V$) compensation applied during the ion current phase is illustrated in FIG. 7 as a linear curve (e.g., first order curve) this configuration is not intended to be limiting as to the scope of the disclosure provided herein, since the compensation provided during the ion current phase can include a non-linear shape due to a need to better adjust the plasma processes performed during this phase of the PV pulse. In some examples, the voltage delta ($\Delta V$) compensation provided during the ion current phase could include a second order, third order, fourth order or even a higher order correction (e.g., $N^{th}$ order). In another example, the voltage delta ($\Delta V$) compensation provided during the ion current phase could include breaking-up the compensation provided during the ion current phase into a series of interconnected sub-steps that form a staircase, spline, or other desired curve shape. In this example, each of the interconnected sub-steps can include a first order, a second order, third order, fourth order or an $N^{th}$ order correction.

At block 310, the compensation factor is applied to correct for the voltage decay within a subsequent portion of the waveform, such as during one or more voltage pulses. Correcting for the voltage decay within a subsequent waveform may include adjusting the at least one characteristic (e.g., bias voltage, current $C_1$) using the compensation factor. In some embodiments, the compensation factor may be applied as a continuous slope. In some embodiments, rather than forming a linear ramp during the ion current stage, the calculated compensation factor may be used to determine a staircase like number of voltage decay steps and the length and/or size of each step to be applied during the ion current stage of each of pulses to correct for the voltage decay. In other words, the compensation factor may be applied in steps as a continuous voltage ramp or a non-linear voltage ramp. In some embodiments, the compensation factor may be applied to a subsequent waveform as a voltage decay step count (e.g., staircase like ramp correction). An example of a compensated waveform, established at the substrate, which includes three steps is shown in FIG. 4B.

In some embodiments, the voltage decay may be estimated during the processing of a wafer (e.g., substrate 103), and the compensation factor may be applied to correct for the voltage decay within a subsequent pulse of a burst for the wafer. In other embodiments, the voltage decay may be estimated during the processing of a wafer, and the compensation factor may be applied to correct for the voltage decay within a subsequent burst.

In some embodiments, the voltage decay may be estimated during the processing of a wafer (e.g., substrate 103), and the compensation factor may be applied to correct for the voltage decay within a subsequent waveform on a subsequent wafer. However, due to the stored voltage decay values and the sheath coupling values, the subsequent wafer need not be a wired wafer, the previously stored voltage decay values and the sheath coupling values may be relied upon to calculate the compensation factor.

In some examples, as illustrated in FIG. 7, the voltage waveforms can be delivered at a frequency ($1/T_p$), which is between about 50 kHz and 1000 kHz. The voltage waveform established at the electrode can have an on-time, which is defined as the ratio of the ion current time period (e.g., length of ion current stage) and the waveform period $T_P$, is greater than 50%, or greater than 70%, such as between 80% and 95%. A voltage waveform, which has a waveform cycle has a period $T_P$ (e.g., about 2.5 μs), can be serially repeated within a waveform burst that has a burst period that is between about 100 microseconds (μs) and about 10 milliseconds (ms). The burst of PV waveforms can have a burst duty cycle that is between about 5%-100%, such as between about 50% and about 95%, wherein the duty cycle is the ratio of the burst period divided by the burst period plus a non-burst period (i.e., no PV waveforms are generated) that separates the burst periods. As shown, the sheath collapse stage may have a duration of TSH (e.g., off-time), which may be about 200 ns.

ADDITIONAL CONSIDERATIONS

As used herein, the term "coupled" is used to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A method for waveform generation, comprising:
   delivering a first waveform with an associated setpoint from an energy source;
   detecting at least one characteristic of the first waveform using at least one sensor;
   determining a voltage decay value during a portion of a pulse provided within the first waveform by use of the detected at least one characteristic and at least one empirically stored voltage decay value function previously derived from wafer-level measurements performed with a wired wafer;
   determining a sheath coupling voltage value during the portion of the pulse of the first waveform by use of the detected at least one characteristic and at least one empirically stored sheath coupling voltage value function;
   calculating a compensation factor based on the determined voltage decay value and the determined sheath coupling voltage value; and
   adjusting at least one characteristic of the first waveform by applying the calculated compensation factor to the at least one characteristic of the first waveform during an ion current stage to maintain a substantially constant sheath potential.

2. The method of claim 1, wherein the first waveform is a high voltage pulse waveform, and establishes a sheath.

3. The method of claim 1, wherein the associated setpoint is a baseline process, voltage and temperature (PVT) setpoint.

4. The method of claim 1, wherein the at least one characteristic is a current sensor metric.

5. The method of claim 1, wherein the at least one sensor is an in-line sensor and is included in a current transformer.

6. The method of claim 1, further comprising:
   detecting at least one value associated with an initial voltage and at least one value associated with a final voltage during the portion of the pulse of the first waveform by using at least one second sensor coupled to the wired wafer;
   determining at least one voltage delta value by using the at least one value associated with an initial voltage and the at least one value associated with a final voltage;
   detecting at least one measured current value during the portion of the pulse of the first waveform by using the at least one second sensor; and
   storing the at least one voltage decay value representing a relationship between the at least one voltage delta value and the at least one measured current value.

7. The method of claim 6, further comprising:
   storing the at least one sheath coupling voltage value representing a second relationship between the at least one value associated with an initial voltage and the at least one measured current value.

8. The method of claim 1, wherein a process, voltage and temperature (PVT) on-time of the first waveform is known.

9. The method of claim 1, wherein the compensation factor is a voltage decay step count.

10. The method of claim 1, wherein adjusting the at least one characteristic of the first waveform comprises applying a continuous voltage ramp to a portion of the pulse.

11. A waveform generator, comprising:
   a sensor assembly coupled to an output of a pulser, wherein the sensor assembly comprises at least one sensor configured to detect at least one characteristic of a first waveform generated by the waveform generator; and
   a system controller coupled to the waveform generator, wherein the system controller comprises:
   a processor and memory, wherein the memory includes instructions which when executed by the processor causes:
   an amount of voltage decay within a portion of a pulse during the first waveform to be determined using at least one empirically stored voltage decay value function previously derived from wafer-level measurements performed with a wired wafer;
   an amount of a sheath coupling voltage within the portion of a pulse of the first waveform to be determined using at least one empirically stored sheath coupling voltage value function;
   a compensation factor based on the determined amount of voltage decay and the determined amount of sheath coupling voltage to be calculated; and
   the at least one characteristic of the first waveform to be adjusted based on the application of the calculated compensation factor during an ion current stage to maintain a substantially constant sheath potential.

12. The waveform generator of claim 11, wherein:
   the first waveform is a high voltage pulse waveform, and the first waveform establishes a sheath.

13. The waveform generator of claim 11, wherein the first waveform has an associated setpoint, and the associated setpoint is a baseline process, voltage and temperature (PVT) setpoint.

14. The waveform generator of claim 11, wherein the at least one characteristic is a current sensor metric.

15. The waveform generator of claim 11, wherein the at least one sensor is an in-line sensor.

16. The waveform generator of claim 11, wherein the memory includes further instructions which when executed by the processor causes:

at least one value associated with an initial voltage and at least one value associated with a final voltage during the portion of the pulse of the first waveform to be determined by using at least one second sensor coupled to the wired wafer;

at least one voltage delta value to be determined by using the at least one value associated with an initial voltage and the at least one value associated with a final voltage;

at least one measured current value during the portion of the pulse of the first waveform to be determined using the at least one second sensor; and the at least one stored voltage decay value function representing a relationship between the at least one voltage delta value and the at least one measured current value to be stored in the memory.

17. The waveform generator of claim 16, wherein the memory includes further instructions which when executed by the processor causes:

the at least one stored sheath coupling voltage value function representing a second relationship between the at least one value associated with an initial voltage and the at least one measured current value to be stored in the memory.

18. The waveform generator of claim 11, wherein a process, voltage and temperature (PVT) on-time of the first waveform is known.

19. The waveform generator of claim 11, wherein the compensation factor is a voltage decay step count.

20. The waveform generator of claim 11, wherein compensation factor is applied as a continuous voltage ramp or a non-linear voltage ramp.

\* \* \* \* \*